US012610772B2

(12) United States Patent
Lee et al.

(10) Patent No.: US 12,610,772 B2
(45) Date of Patent: *Apr. 21, 2026

(54) SUBSTRATE PROCESSING APPARATUS, SUBSTRATE PROCESSING METHOD AND METHOD OF FABRICATING SEMICONDUCTOR DEVICE

(71) Applicant: SAMSUNG ELECTRONICS CO., LTD., Suwon-si (KR)

(72) Inventors: Woo Rim Lee, Suwon-si (KR); Myoung Jae Seo, Suwon-si (KR); Sung Gil Kang, Suwon-si (KR); Hyun Ho Doh, Suwon-si (KR); Sung Yong Park, Suwon-si (KR); In Hye Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 174 days.

This patent is subject to a terminal disclaimer.

(21) Appl. No.: 18/240,008

(22) Filed: Aug. 30, 2023

(65) Prior Publication Data

US 2024/0120213 A1     Apr. 11, 2024

(30) Foreign Application Priority Data

Oct. 7, 2022     (KR) ........................ 10-2022-0129059
Mar. 15, 2023     (KR) ........................ 10-2023-0033944

(51) Int. Cl.
*H01L 21/67*     (2006.01)
*H01J 37/32*     (2006.01)
*H10P 14/43*     (2026.01)

*H10P 50/24*     (2026.01)
*H10P 72/00*     (2026.01)

(52) U.S. Cl.
CPC .... *H10P 72/0421* (2026.01); *H01J 37/32357* (2013.01); *H01J 37/32449* (2013.01); *H10P 14/432* (2026.01); *H10P 50/242* (2026.01); *H01J 2237/334* (2013.01)

(58) Field of Classification Search
None
See application file for complete search history.

(56) References Cited

U.S. PATENT DOCUMENTS

| | | |
|---|---|---|
| 7,462,335 B2 | 12/2008 | Liu et al. |
| 8,518,283 B2 | 8/2013 | Yamamoto et al. |
| 9,218,944 B2 | 12/2015 | Chandrachood et al. |
| 9,887,071 B2 | 2/2018 | Chen et al. |
| 9,966,240 B2 | 5/2018 | Park et al. |
| 9,972,478 B2 | 5/2018 | Guha et al. |
| 10,515,813 B2 | 12/2019 | Chang et al. |

(Continued)

*Primary Examiner* — Shamim Ahmed
(74) *Attorney, Agent, or Firm* — Sughrue Mion, PLLC

(57)     ABSTRACT

A method of fabricating a semiconductor device is provided. The method includes: loading a substrate into a substrate processing apparatus; and processing the substrate, using the substrate processing apparatus. The processing the substrate includes: providing a process gas; generating a process etchant from the process gas, using plasma ignition, the process etchant including a first etchant and a second etchant; processing the substrate, using the process etchant; identifying a composition rate of the process etchant; and controlling the processing of the substrate based on a process result according to the composition rate of the process etchant.

14 Claims, 23 Drawing Sheets

(56)     References Cited

U.S. PATENT DOCUMENTS

| | | | |
|---|---|---|---|
| 11,232,946 B2 | 1/2022 | Chu et al. | |
| 2013/0183773 A1* | 7/2013 | Tseng .................. | G01N 31/221 |
| | | | 436/101 |
| 2020/0266070 A1* | 8/2020 | Voronin ........... | H01L 21/32136 |
| 2020/0373168 A1* | 11/2020 | Lee .................. | H01J 37/32422 |

* cited by examiner

FIG. 4

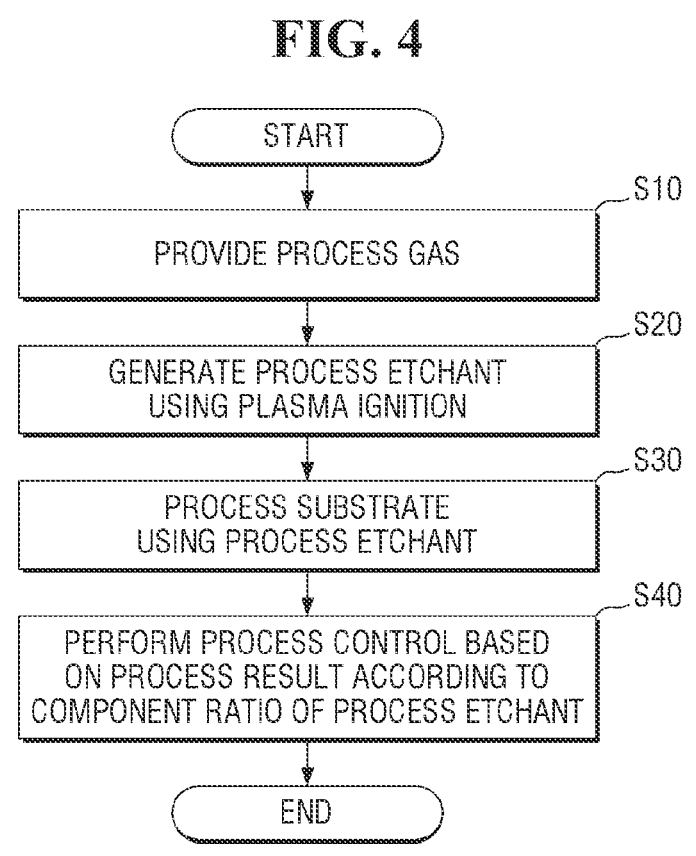

START

↓

PROVIDE PROCESS GAS — S10

↓

GENERATE PROCESS ETCHANT
USING PLASMA IGNITION — S20

↓

PROCESS SUBSTRATE
USING PROCESS ETCHANT — S30

↓

PERFORM PROCESS CONTROL BASED
ON PROCESS RESULT ACCORDING TO
COMPONENT RATIO OF PROCESS ETCHANT — S40

↓

END

FIG. 17

SUBSTRATE PROCESSING APPARATUS, SUBSTRATE PROCESSING METHOD AND METHOD OF FABRICATING SEMICONDUCTOR DEVICE

CROSS-REFERENCE TO RELATED APPLICATIONS

This application claims priority to Korean Patent Application No. 10-2022-0129059, filed on Oct. 7, 2022, in the Korean Intellectual Property Office, and Korean Patent Application No. 10-2023-0033944, filed on Mar. 15, 2023, in the Korean Intellectual Property Office, the disclosures of which are incorporated by reference herein in their entireties.

BACKGROUND

1. Technical Field

The present disclosure relates to a substrate processing apparatus, a substrate processing method, and a method of fabricating a semiconductor device. More specifically, the present disclosure relates to a substrate processing apparatus, a substrate processing method, and a method of fabricating a semiconductor device, using plasma.

2. Description of Related Art

A semiconductor device may be formed by various semiconductor fabricating processes such as an etching process, a deposition process, an ashing process, a cleaning process, and a plasma process of accelerating desired chemical reactions (e.g., deposition or etching).

As the fabricating process of the semiconductor device advances, methods capable of efficiently controlling an etching selectivity are being researched to realize a desired pattern using the etching process. For example, silicon germanium (SiGe), which is widely used as a sacrificial film in a process for forming multi-bridge channel or the like, may require a high etching selectivity with respect to silicon (Si). However, a lower selectivity may be required according to an object of a specific process such as an etching rate control, and a process variation arising from a critical dimension may require various etching selectivity controls.

SUMMARY

One or more example embodiments provide a method of fabricating a semiconductor device using a substrate processing method in which a constant process performance is ensured even when the process is repeated.

One or more example embodiments also provide a substrate processing method in which a constant process performance is ensured even when the process is repeated.

One or more example embodiments also provide a substrate processing apparatus in which a constant process performance is ensured even when the process is repeated.

Aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of an example embodiment, a method of fabricating a semiconductor device, includes: loading a substrate into a substrate processing apparatus; and processing the substrate, using the substrate processing apparatus. The processing the substrate includes: providing a process gas; generating a process etchant from the process gas, using plasma ignition, the process etchant including a first etchant and a second etchant; processing the substrate, using the process etchant; identifying a composition rate of the process etchant; and controlling the processing of the substrate based on a process result according to the composition rate of the process etchant.

According to another aspect of an example embodiment, a substrate processing method includes: providing a process gas; generating a process etchant from the process gas using a plasma ignition, the process etchant including a first etchant and a second etchant; processing a substrate using the process etchant; and controlling the processing the substrate. The controlling includes: establishing a backbone process for processing a backbone substrate using the process etchant, the process etchant having a predetermined composition rate; setting a sweet zone including a process result value for the backbone process; performing a window test on at least one process parameter of the backbone process to establish a look-up table indicating a plurality of process result values according to the at least one process parameter; and performing a feedback control such that a process result value for processing the substrate is provided within the sweet zone, by controlling the at least one process parameter using the look-up table, based on the process result value for processing the substrate deviating from the sweet zone.

According to still another aspect of an example embodiment, a substrate processing apparatus includes: a chamber body; a substrate support provided in the chamber body; a substrate provided on the substrate support; a gas supplier configured to supply the chamber body with a process gas; a plasma generator configured to generate plasma from the process gas; a showerhead configured to supply a process etchant generated from the plasma onto the substrate, the process etchant including a first etchant and a second etchant; a first analyzer which is connected to the chamber body and configured to measure a composition rate of the process etchant; and a controller which is connected to at least one of the chamber body, the gas supplier, the plasma generator and the showerhead, and configured to perform a process control based on the composition rate of the process etchant measured by the first analyzer.

BRIEF DESCRIPTION OF DRAWINGS

The above and other aspects and features of the present disclosure will become more apparent from the following description of example embodiments, taken in conjunction with the attached drawings, in which:

FIG. 4 is a flow chart for explaining the substrate processing method according to some example embodiments.

FIGS. 16 to 23 are intermediate process diagrams for explaining a method of fabricating a semiconductor device according to some example embodiments.

DETAILED DESCRIPTION

Hereinafter, example embodiments will be described in detail with reference to the accompanying drawings. It will be understood that, although the terms "first," "second," and/or "third" may be used herein to describe various elements, these elements should not be limited by these terms. These terms are only used to distinguish one element from another element. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

A substrate processing apparatus according to example embodiments will be described below with reference to FIGS. 1 to 3.

Figure 1:
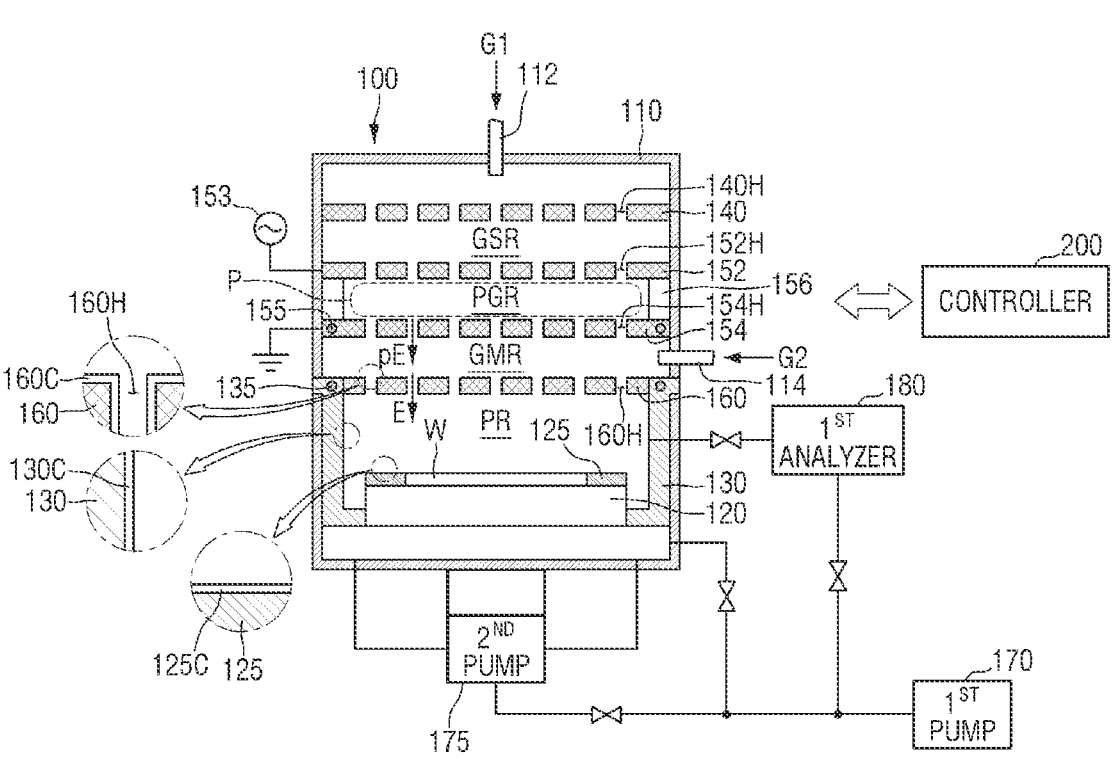
FIG. 1 is an exemplary conceptual diagram for explaining the substrate processing apparatus according to some example embodiments.

FIG. 1 is an exemplary conceptual diagram for explaining the substrate processing apparatus according to some example embodiments. FIGS. 2 and 3 are diagrams for explaining a process etchant provided in the substrate processing apparatus of FIG. 1.

Figure 2:
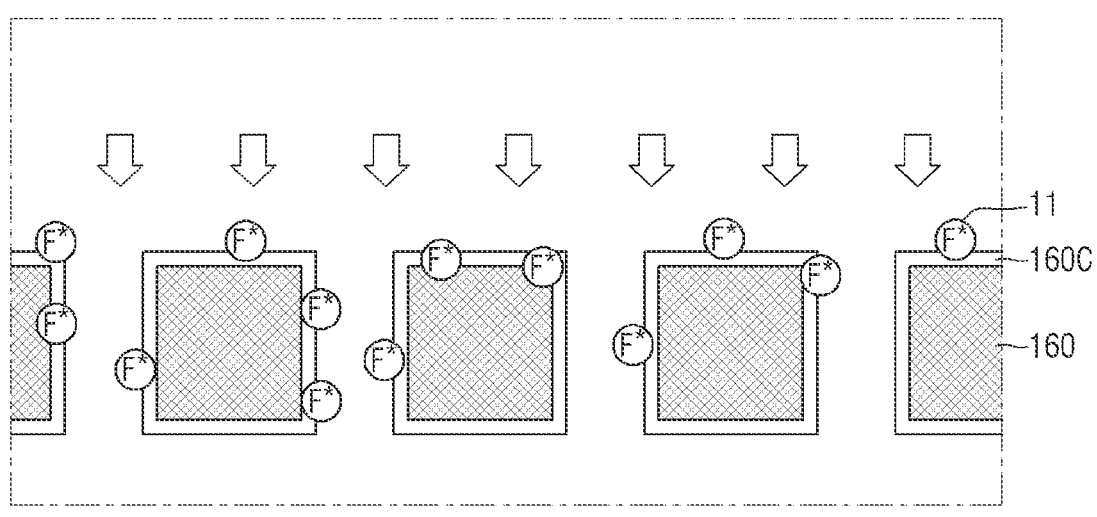
FIGS. 2 and 3 are diagrams for explaining a process etchant provided in the substrate processing apparatus of FIG. 1.
Figure 3:
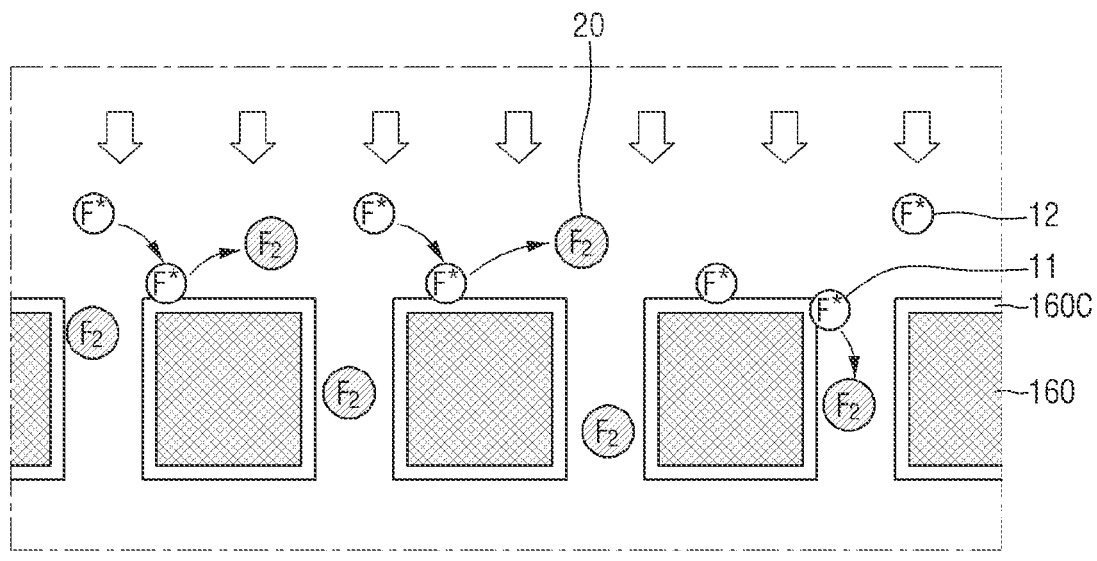

Referring to FIGS. 1 to 3, the substrate processing apparatus according to some example embodiments may include a process chamber 100, a first gas supplier 112, a second gas supplier 114, a first pump 170, a second pump 175, a first analyzer 180, and a controller 200.

The process chamber 100 may provide a space for processing a substrate W using a plasma process. The substrate W is a target of process performed in the process chamber 100, and may include a wafer and/or at least one material film on the wafer. The process for processing the substrate W may include, but is not limited to, various processes such as an etching process, a deposition process, an ashing process, and a cleaning process. In some example embodiments, the etching process and the cleaning process may be performed together (e.g., in-situ) inside the process chamber 100.

The first gas supplier 112 may supply a first process gas G1 into the process chamber 100. The first process gas G1 may be a source gas for generating the plasma P. In some example embodiments, the first process gas G1 may include a fluorine (F)-containing gas. For example, the first process gas G1 may include, but is not limited to, at least one of $NF_3$, $SiF_6$, $CF_4$, and HF. In some example embodiments, the first process gas G1 may further include an inert gas such as helium (He).

The second gas supplier 114 may supply a second process gas G2 into the process chamber 100. The second process gas G2 may be a source gas mixed to form a process etchant (E). In some example embodiments, the second process gas G2 may include $F_2$ gas ($F_2$ gas). In some example embodiments, the second process gas G2 may include hydrogen (H)-containing gas. For example, the second process gas G2 may include, but is not limited to, $NH_3$. In some other example embodiments, the second gas supplier 114 may be omitted.

The process chamber 100 may include various regions for the plasma process. In some example embodiments, the process chamber 100 may include a gas supply region GSR for uniformly supplying the first process gas G1, a plasma generation region PGR for generating plasma P from the first process gas G1, a gas mixing region GMR for mixing the plasma and the second process gas G2, and a processing region PR for disposing and processing the substrate W. For example, the process chamber 100 may include a chamber body 110, a substrate support 120, a focus ring 125, a liner 130, a gas supply plate 140, an upper electrode plate 152, a lower electrode plate 154, and a showerhead 160.

The chamber body 110 may provide an internal space for processing the substrate W, and separate the internal space from the outside. The chamber body 110 may be clean room equipment capable of controlling a pressure and a temperature with a high precision. An overall external structure of the chamber body 110 may be, but is not limited to, a cylindrical shape, an elliptical cylindrical shape or a polygonal cylindrical shape. The chamber body 110 may include, but is not limited to, metallic materials such as aluminum (Al). In some example embodiments, the chamber body 110 may be kept in a grounded state to block a noise from outside that may occur at the time of the plasma process.

The substrate support 120 may be disposed inside the chamber body 110. The substrate W may be disposed on and supported by the substrate support 120. The substrate support 120 may include, for example, but is not limited to, an electrostatic chuck (ESC).

A focus ring 125 may be disposed on the substrate support 120. The focus ring 125 may be in the form of a ring that surrounds the substrate W disposed on the substrate support 120. The focus ring 125 may fix the substrate W disposed on the substrate support 120. Also, the focus ring 125 may focus the process etchant E (or the plasma P) toward a surface of the substrate W to improve efficiency of the plasma process. The focus ring 125 may include, for example, but is not limited to, silicon (Si).

A liner 130 may be disposed inside the chamber body 110. The liner 130 may define a processing region PR in which the substrate W is processed. For example, the liner 130 may extend from the lower part of the substrate support 120 and surround the side faces of the substrate support 120, and define a lower face and side face of the processing region PR. In addition, the liner 130 protects the chamber body 110 and covers metal structures protruding from the chamber body 110, thereby preventing metal contamination or the like due to arcing. The liner 130 may include, but is not limited to, metallic materials such as aluminum (Al), ceramic materials, and the like.

The gas supply plate 140 may be disposed on the upper electrode plate 152. The gas supply plate 140 and the upper electrode plate 152 may define a gas supply region GSR therebetween. The gas supply plate 140 may provide the first process gas G1, which is provided from the first gas supplier 112, to the gas supply region GSR. For example, the gas supply plate 140 may include a plurality of first holes 140H. The first process gas G1 may be provided to the gas supply region GSR through the first holes 140H.

The upper electrode plate 152 may be disposed on the lower electrode plate 154. The upper electrode plate 152 and the lower electrode plate 154 may define a plasma generation region PGR therebetween. The upper electrode plate 152 may provide the first process gas G1, which is provided from the gas supply region GSR, to the plasma generation region PGR. For example, the upper electrode plate 152 may include a plurality of second holes 152H. The first process gas G1 may be provided to the plasma generation region PGR through the second holes 152H.

A plasma generator may be provided to generate the plasma P in the plasma generation region PGR. In some example embodiments, the upper electrode plate 152 may be provided as the upper electrode of the plasma generator, and the lower electrode plate 154 may be provided as the lower electrode of the plasma generator. For example, a power supply 153 may be connected to the upper electrode plate 152 to apply an RF power, and the lower electrode plate 154 may be grounded. Also, an insulating ring 156 may be interposed between the upper electrode plate 152 and the lower electrode plate 154, and the insulating ring 156 may electrically separate the upper electrode plate 152 and the lower electrode plate 154. When the first process gas G1 is provided to the plasma generation region PGR, the RF power is applied to the upper electrode plate 152 and the plasma P may be generated in the plasma generation region PGR.

In some example embodiments, the plasma P generated from the first process gas G1 may include radicals. For example, when the first process gas G1 includes a fluorine-containing gas, the generated plasma P may include F-radicals (F*).

In some example embodiments, the plasma P generated from the first process gas G1 may also include components such as ions, electrons, ultraviolet rays, including radicals. At least one of the aforementioned components may be used in the etching process, the deposition process and/or the cleaning process. For reference, the radicals are electrically neutral and therefore may be used for the cleaning process or the isotropic etching process. Alternatively, radicals may be used to hinder or suppress the deposition of certain constituents in the deposition process. On the other hand, ions electrically have polarity and therefore may be used in the anisotropic etching process.

Although only a Capacitively Coupled Plasma (CCP) type was described as a type of plasma generator in the description of FIG. 1, this is merely an example, and the technical idea of the present disclosure is not limited thereto. In some other example embodiments, the plasma generator may be an Inductively Coupled Plasma (ICP) type, or a hybrid of the CCP type with the ICP type.

The lower electrode plate 154 may be disposed on the showerhead 160. The lower electrode plate 154 and the showerhead 160 may define a gas mixing region GMR therebetween. The lower electrode plate 154 may generate a preliminary etchant pE by providing at least a part of the plasma P generated in the plasma generation region PGR to the gas mixing region GMR. For example, the lower electrode plate 154 may include a plurality of third holes 154H. The preliminary etchant pE may be provided to the gas mixing region GMR through the third hole 154H. The preliminary etchant pE provided to the gas mixing region GMR may generate a process etchant E for processing the substrate W.

In some example embodiments, the plasma P generated in the plasma generation region PGR may be used for the radical-based plasma process. For example, the lower electrode plate 154 may allow radicals to selectively pass from the plasma P generated in the plasma generation region PGR. Thus, the radicals generated from the first process gas G1 may be provided to the gas mixing region GMR to form the preliminary etchant pE including the radicals. Other components such as ions, electrons and ultraviolet rays in the plasma P generated in the plasma generation region PGR may be blocked without passing through the lower electrode plate 154.

The second gas supplier 114 may provide the second process gas G2 to the gas mixing region GMR. In some example embodiments, the second process gas G2 may be mixed with the preliminary etchant pE in the gas mixing region GMR to form the process etchant E.

The showerhead 160 may be disposed on the substrate support 120. The showerhead 160 may define a processing region PR with the liner 130. For example, the liner 130 may define a lower face and side faces of the processing region PR, and the showerhead 160 may define an upper face of the processing region PR. The showerhead 160 may provide the process etchant E, which is provided from the gas mixing region GMR (or plasma P), to the processing region PR. For example, the showerhead 160 may include a plurality of fourth holes 160H. The etchant E (or plasma P) may be provided to the processing region PR through the fourth holes 160H.

The gas supply plate 140, the upper electrode plate 152, the lower electrode plate 154, and the showerhead 160 may each have, but are not limited to, various shapes such as a disk shape, an elliptical plate shape, and a polygonal plate shape. The gas supply plate 140, the upper electrode plate 152, the lower electrode plate 154, and the showerhead 160 may each include, but are not limited to, a material that is highly resistant to plasma, for example, a metal material or a ceramic material.

In some example embodiments, at least a part of the surface of the process chamber 100 may be coated with a film of material that is highly resistant to the plasma P. As an example, as shown, the surface of the focus ring 125 may be coated with a first coating film 125C, the surface of the liner 130 may be coated with a second coating film 130C, and the surface of the showerhead 160 may be coated with a third coating film 160C. The first coating film 125C, the second coating film 130C, and the third coating film 160C may each include, but are not limited to, at least one of $Y_2O_3$, YOF, $YF_3$, Ni, $Al_2O_3$, AlOF, AlN, Al, $SiO_2$ (quartz), $ZrO_2$, and ceramic. The first coating film 125C, the second coating film 130C, and the third coating film 160C may include the same material, or may include the materials different from each other.

The process etchants E provided into the processing region PR may include different etching species (i.e., different types of etchants). For example, the process etchant E may include a first etchant and a second etchant that have different etching selectivity with respect to an etching target (e.g., the substrate W). As an example, if the process gas includes a fluorine-containing gas, the first etchant may include F-radicals (F*), and the second etchant may include $F_2$. $F_2$ of the second etchant may be $F_2$ gas ($F_2(g)$) or $F_2$-radical ($F_2$*). $F_2$ of the second etchant may be formed, for example, by bonding between F-radicals (F*), or may be supplied through the second gas supplier 114 as the second process gas G2.

As the preliminary etchant pE generates the process etchant E via the gas mixing region GMR, the composition rate of the process etchant E may differ from the composition rate of the preliminary etchant pE. For example, a plasma P containing F radicals (F*) may be provided as a preliminary etchant pE to the gas mixing region GMR and/or the processing region PR. At this time, at least some of the F radicals (F*) may be adsorbed onto the surface of the process chamber 100 (e.g., the surface of the focus ring 125, the surface of the liner 130, and/or the surface of the showerhead 160). As an example, as shown in FIG. 2, at least some (11 of FIG. 2) of the F-radicals (F*) may be adsorbed onto the surface of the showerhead 160 (and/or the surface of the third coating film 160C). Subsequently, as shown in FIG. 3, another part (12 of FIG. 3) of the F-radicals (F*) may be recombined with the F-radicals 11 adsorbed onto the surface of the process chamber 100 to generate $F_2$ (20 of FIG. 3). The generated $F_2$ may be $F_2$ gas ($F_2(g)$) or $F_2$-radical ($F_2$*).

In some example embodiments, a generation rate of $F_2$ (or a combining rate between F-radicals (F*)) may be controlled depending on the surface conditions of the process chamber 100. Here, the surface conditions of the process chamber 100 refer to conditions including the a surface material of the process chamber 100 applied to the process chamber 100, presence and absence and type of the coating film applied to the surface of the process chamber 100 (e.g., the first to third coating films 125C, 130C and 160C). Accordingly, the process etchant E in which a rate (e.g., F*/$F_2$) of the first etchant to the second etchant is controlled may be generated from the preliminary etchant pE. Because the first etchant and the second etchant may have different etching selectivity with respect to the etching target, the process etchant E may have a predetermined etching selectivity according to the rate (e.g., F*/$F_2$) of the first etchant to the second etchant.

A first pump 170 and a second pump 175 may each be connected to the chamber body 110. The first pump 170 and the second pump 175 are each controlled by valves connected thereto to adjust the pressure inside the chamber body 110. The valves may include, for example, but are not limited to, a throttle valve or an automatic pressure controller.

In some example embodiments, the first pump 170 may include a dry pump. Unlike an oil diffusion pump, the dry pump may not include oil that performs sealing and lubricating functions to maintain the vacuum within the process chamber. The dry pump may provide vacuum pressures on the order of about 10-2 mbar, and have the advantage of high vacuum cleanliness. The dry pump may be, for example, but is not limited to, at least one of a claw pump, a multi stage roots pump, a combination pump of roots and claw, a scroll pump, a screw pump, a diaphragm pump, and a molecular drag pump.

In some example embodiments, the second pump 175 may include a turbo molecular pump (TMP). The turbo molecular pump is a type of vacuum pump similar to a turbo pump, and may establish and maintain a vacuum. The turbo the molecular pump may, for example, include a fan rotor that rapidly rotates. The turbo molecular pump may provide high vacuum pressures by controlling the magnitude and direction of the momentum of gas molecules by a fan rotor. In some example embodiments, the second pump 175 may be provided between the process chamber 100 and the first pump 170. In some example embodiments, an automatic pressure controller may be interposed between the chamber body 110 and the second pump 175.

A first analyzer 180 may be connected to the chamber body 110. The first analyzer 180 may analyze the gas inside the processing region PR. For example, the first analyzer 180 may measure and analyze a composition rate of the process etchant E provided in the processing region PR. As an example, the first analyzer 180 may measure the rate (e.g., F*/$F_2$) of first etchant to second etchant of the process etchant E.

In some example embodiments, the first analyzer 180 may include a residual gas analyzer (RGA). The residual gas analyzer is a device that measures residual gas in a vacuum system on the basis of mass spectrometry, and may monitor the amount of gas or chemical reactions in the vacuum system in real time. In some example embodiments, the first analyzer 180 may be provided between the process chamber 100 and the first pump 170. In this case, a gas flow passing through the first analyzer 180 may be improved.

The controller 200 may be connected to the process chamber 100, the first gas supplier 112, the second gas supplier 114, the first pump 170, the second pump 175, and/or the first analyzer 180 to perform a process control on the substrate W. The controller 200 may be implemented as hardware, firmware, software or any combination thereof. For example, the controller 200 may be a computing device such as a workstation computer, a desktop computer, a laptop computer, and a tablet computer. The controller 200 may be a simple controller, a microprocessor, a CPU, a complex processor such as a GPU, a processor configured by software, dedicated hardware or firmware. In some example embodiments, the controller 200 may provide advanced process control (ADP) functionality. The advanced process control (APC) is a solution for finding optimized process parameters when performing the process, and may provide an improved process control effect, by automatically changing process parameters of a process to be performed later with reference to process results performed before.

In some example embodiments, the controller 200 may perform the process control by controlling the process chamber 100, the first gas supplier 112, the second gas supplier 114, the first pump 170 and/or the second pump 175, on the basis of the composition rate (e.g., F*/$F_2$) of the process etchant E monitored through the first analyzer 180. The above process control will be described in more detail later in the description relating to FIGS. 5 to 9.

In some example embodiments, the controller 200 may perform the process control, using a correlation between the process etchant E and the plasma P (or preliminary etchant pE). The above process control will be described in more detail later in the description relating to FIGS. 13 and 14.

In some example embodiments, the process chamber 100 may further include temperature controllers 135 and 155.

For example, the first temperature controller 135 may be disposed inside the liner 130. The first temperature controller 135 may have, but is not limited to, a ring shape extending generally along the upper part of the liner 130. The first temperature controller 135 may be adjacent to the showerhead 160. Accordingly, the first temperature controller 135 may control the temperature of the showerhead 160.

In some example embodiments, the first temperature controller 135 may keep the temperature of the showerhead 160 constant at a predetermined set temperature. For example, the first temperature controller 135 may control the temperature of the showerhead 160 from about 50° C. to about 200° C.

Also, for example, the second temperature controller 155 may be disposed in the lower electrode plate 154. The second temperature controller 155 may have, but is not limited to, a ring shape extending substantially along an outer peripheral surface of the lower electrode plate 154. In some example embodiments, the second temperature controller 155 may control the temperature of the lower electrode plate 154. In some example embodiments, the second temperature controller 155 may keep the temperature of the lower electrode plate 154 constant at a predetermined set temperature. For example, the second temperature controller 155 may control the temperature of the lower electrode plate 154 from about 50° C. to about 200° C.

The temperature controllers 135 and 155 may each be, but are not limited to, heaters. For example, each of the temperature controllers 135 and 155 may include a heating element that generates heat, a temperature sensor and a control circuit that controls electrical current to flow through the heating element according to a temperature sensed by the temperature sensor.

A generation rate of $F_2$ according to recombination between F-radicals (F*) varies depending on the temperature at the surface of the process chamber 100. As an example, when the surface of the process chamber 100 is coated with nickel (Ni), the generation rate of $F_2$ is known to show a maximum value at about 90° C. to about 110° C. Accordingly, the substrate processing apparatus according to some example embodiments may more effectively control the etching selectivity, using the temperature controllers 135 and 155.

A substrate processing method according to example embodiments will be described below with reference to FIGS. 1 to 9. Although FIGS. 3 to 9 show a plasma process using the F-radical (F*)-based etchant, it will be understood by those of ordinary skill in the art to which the present disclosure pertains that the technical idea of the present disclosure may also be applied to a plasma process that uses other etchants.

FIG. 4 is a flow chart for explaining the substrate processing method according to some example embodiments.

Referring to FIGS. 1 to 4, first, a process gas is provided (S10).

For example, a first process gas G1 may be provided into the process chamber 100 through the first gas supplier 112. In some example embodiments, the process gas may include a fluorine (F)-containing gas. For example, the process gas may include at least one of $NF_3$, $SiF_6$, $CF_4$ and HF. In some example embodiments, the process gas may further include an inert gas such as helium (He).

A process etchant is then generated from the process gas, using a plasma ignition (S20).

For example, when the first process gas G1 is provided to the plasma generation region PGR through the first gas supplier 112, the RF power may be applied to the upper electrode plate 152 to generate the plasma P. At least some of the generated plasma P may be provided to the gas mixing region GMR to generate the preliminary etchant pE. In some example embodiments, the preliminary etchant pE may include radicals. For example, if the first process gas G1 includes a fluorine-containing gas, the preliminary etchant pE may include F-radicals (F*). The process etchant E may be generated from the preliminary etchant pE.

The process etchant E generated from the preliminary etchant pE may include different etch species (i.e., different types of etchants). For example, the process etchant E may include a first etchant and a second etchant that have different etching selectivity with respect to an etching target (e.g., substrate W). As an example, if the process gas includes a fluorine-containing gas, the first etchant may include F-radicals (F*) and the second etchant may include $F_2$. $F_2$ of the second etchant may be $F_2$ gas ($F_2$(g)) or may be $F_2$-radical ($F_2$*). $F_2$ of the second etchant may be formed, for example, by combination between F-radicals (F*), or may be supplied through the second gas supplier 114 as the second process gas G2.

Next, the substrate is processed using the process etchant (S30).

For example, the process etchant E may perform an etching process on the substrate W in the processing region PR. Because the process etchant E has a predetermined etching selectivity according to the rate of the first etchant to the second etchant, it is possible to perform selective etching process on various film qualities.

Subsequently, the process control is performed on the basis of the process result according to the composition rate of the process etchant (S40).

For example, the process control for processing the substrate W may be performed on the basis of the process results according to the rate (e.g., $F*/F_2$) of the first etchant to the second etchant of the process etchant E. The process control may include advanced process control (APC). As the process control is performed, a constant process performance may be continuously ensured even in the repeated process progress.

When processing of the substrate W includes a selective etching process, the process results may include, for example, but is not limited to, at least one of an etching selectivity, an etching volume, a substrate contamination, a yield, and a residue volume after etching. When processing of the substrate W includes a selective etching process for fabricating a field effect transistor (FET), the process result may also include whether there is a shot between a source/drain and a gate.

The operation of performing the above process control will be described later in more detail in the explanations relating to FIGS. 5 to 9.

Figure 5:
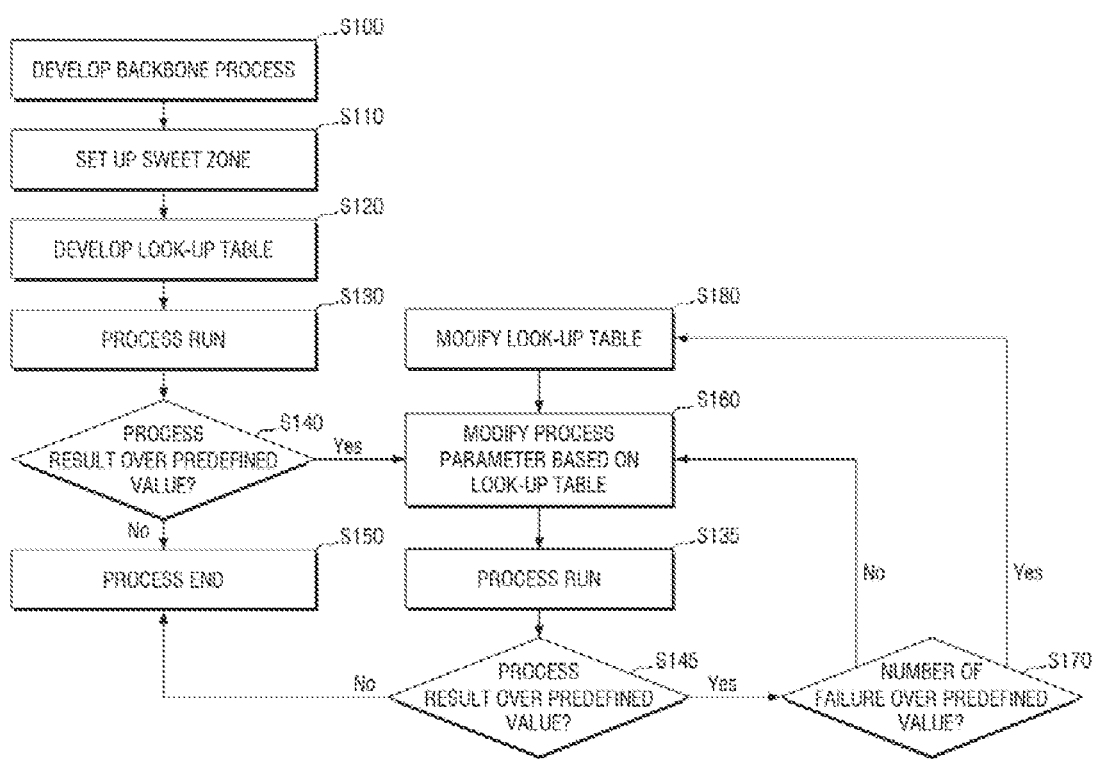
FIG. 5 is an exemplary flow chart for explaining the operation of performing the process control in a substrate processing method according to some example embodiments.

FIG. 5 is an exemplary flow chart for explaining the operation of performing the process control in a substrate processing method according to some example embodiments. FIGS. 6 to 9 are exemplary graphs for explaining the operation of performing the process control according to FIG. 5. For convenience of explanation, repeated parts of contents explained above using FIGS. 1 to 4 will be briefly explained or omitted. For reference, FIGS. 6 to 9 exemplify that the process result is the etching selectivity.

Figure 6:
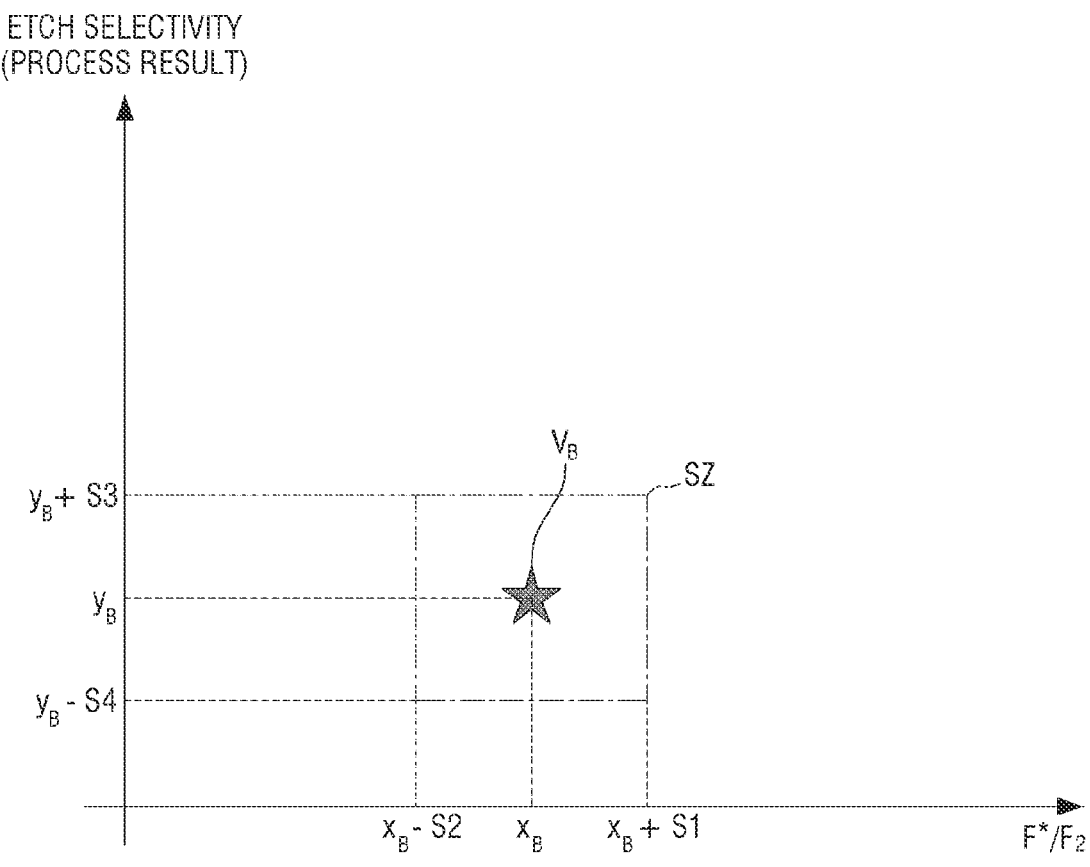
FIGS. 6 to 9 are exemplary graphs for explaining the operation of performing the process control according to FIG. 5.

Referring to FIGS. 5 and 6, a backbone process is first established (S100).

The backbone process may be a standard for the process control. The backbone process may include an operation of processing a backbone substrate using a process etchant having a predetermined composition rate. For example, a process gas may be provided (e.g., S10 of FIG. 2), the process etchant having a predetermined composition rate may be generated from the process gas using the plasma ignition (e.g., S20 of FIG. 2), and the backbone substrate may be processed, using the process etchant (e.g., S30 of FIG. 2). The backbone process may be performed, for example, by the substrate processing apparatus described above using FIG. 1.

Because the process etchant has a predetermined composition rate in the backbone process, the backbone process may have a specific process result value. The process result value may be expressed as a process result with respect to the composition rate of the process etchant. For example, as shown in FIG. 6, $F^*/F_2$ of process etchant E in the backbone process may be $x_B$, and the resulting etching selectivity of the backbone process may be $y_B$. That is, in the graph of FIG. 6, the process result value $V_B$ of the backbone process may be represented by $(x_B, y_B)$. $F^*/F_2$ may be measured, for example, by the first analyzer 180.

Next, a sweet zone is set (S110).

The sweet zone may be defined as a predetermined region around the process result value $V_B$ of the backbone process. For example, as shown in FIG. 6, the $F^*/F_2$ range of the sweet zone SZ may be defined in a predetermined range (e.g., $x_B$–S2 to $x_B$+S1) including $F^*/F_2$ ($x_B$) of the backbone process, and the etching selectivity range of the sweet zone SZ may be defined in a predetermined range (e.g., $y_B$–S4 to $y_B$+S3) including the etching selectivity of the backbone process. The sweet zone SZ including the process result value $V_B$ of the backbone process may be set accordingly.

Figure 7:
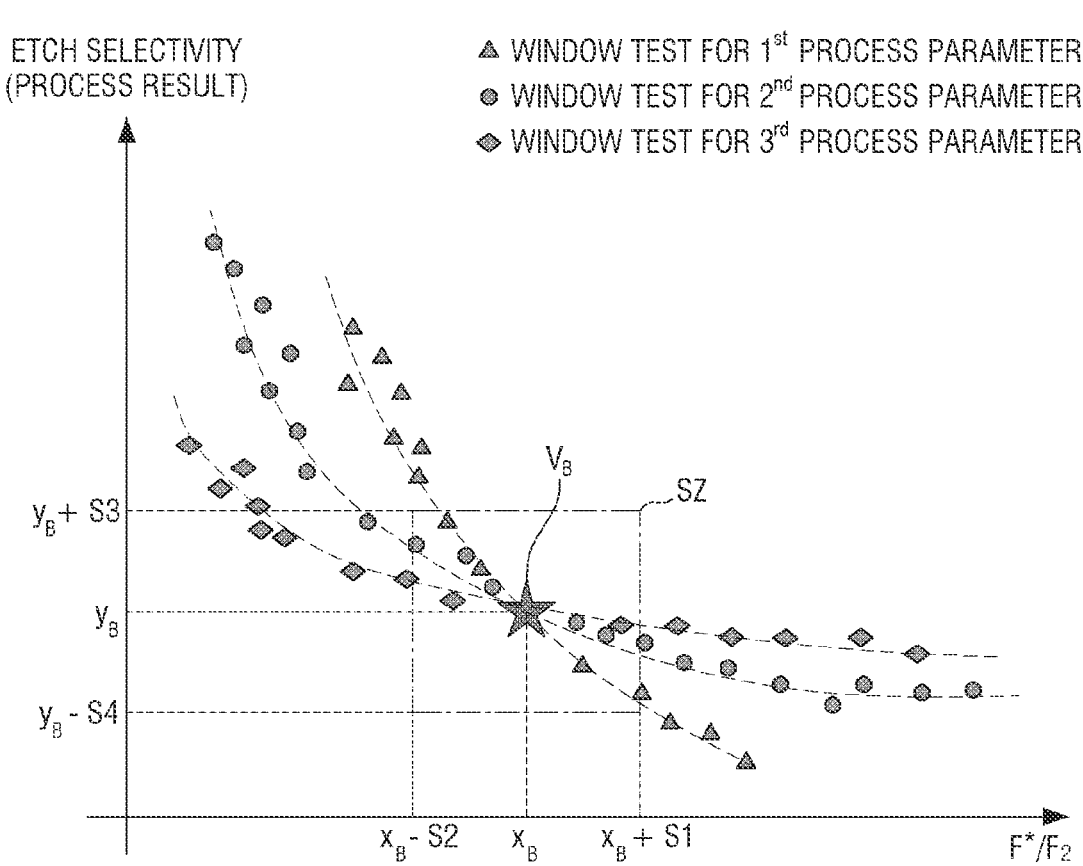

Referring to FIGS. 5 and 7, a look-up table is then established (S120).

The look-up table may be established by performing a window test on at least one process parameter of the backbone process. The operation of performing the window test may include an operation of measuring the changing composition rate of the process etchant and the changing process result by changing at least one process parameter. The look-up table including a plurality of process result values according to at least one process parameter may be provided accordingly.

The process parameter may include, for example, but is not limited to, at least one of a process temperature, a process pressure, a process time, a flow rate of the process gas, and a power of the plasma ignition. When the operation of processing the substrate W includes an etching process for a pattern on the substrate W, the process parameter may include characteristics of the patterns (e.g., depths, lengths, densities, etc. of the patterns).

For example, as shown in FIG. 7, first to third process parameters may be selected as at least one process parameter. A window test may then be performed for each of the first through third process parameters. Specifically, $F^*/F_2$ and etching selectivity may be measured, while fixing the second and third process parameters and varying the first process parameters. Accordingly, a plurality of process result values according to the first process parameter may be shown in FIG. 7. In a similar manner, the plurality of process result values for respective second and third process parameters may be shown in FIG. 7. The look-up table including the plurality of process result values according to first through third process parameters may be provided accordingly. $F^*/F_2$ may be measured, for example, by the first analyzer 180.

Figure 8:
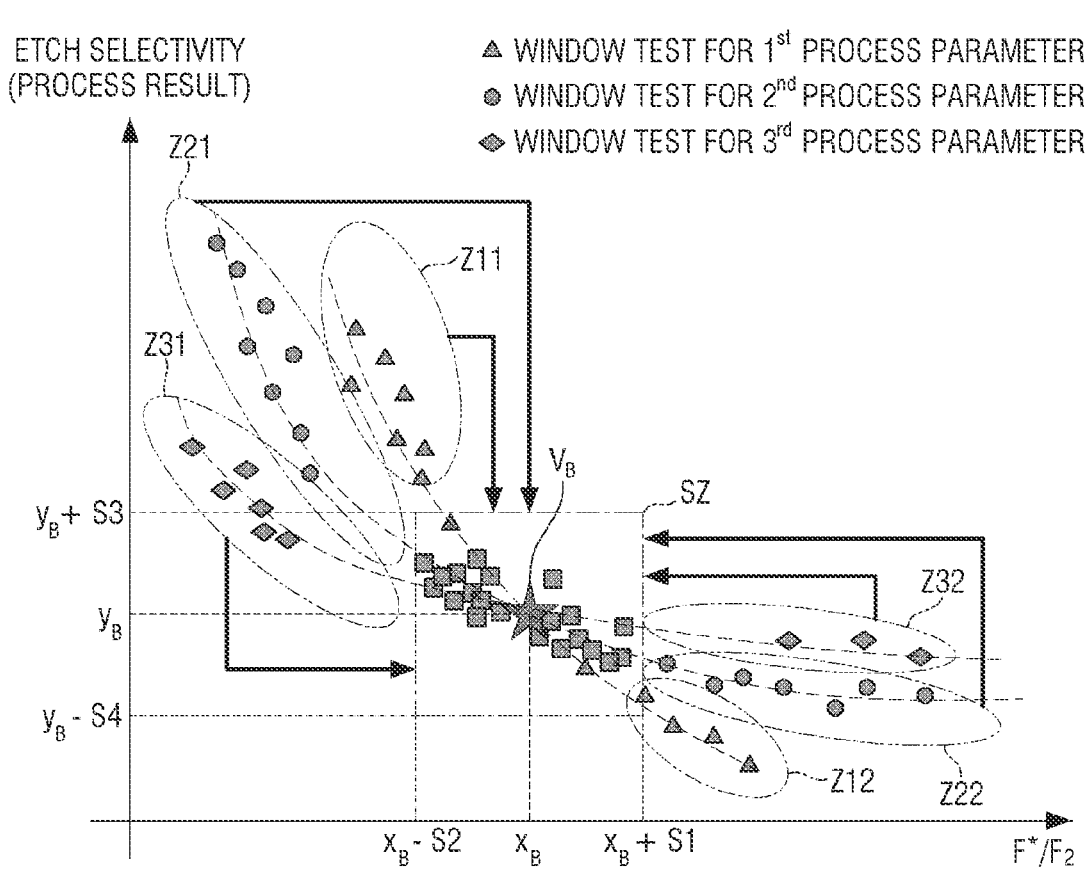

Referring to FIGS. 5 and 8, a feedback control is then performed (S130 to S180).

For example, first, the process for the substrate W (hereinafter referred to as the first substrate) may be performed (S130). For example, a process gas may be provided (e.g., S10 of FIG. 2), the process etchant having a predetermined composition rate may be generated from the process gas using the plasma ignition (e.g., S20 of FIG. 2), and the first substrate may be processed, using the process etchant (e.g., S30 of FIG. 2).

If the process result of the process for the first substrate does not exceed a predetermined value (S140), the process for the first substrate may be terminated (S150). For example, if the process result values for processing the first substrate are located within the sweet zone SZ, the process for the first substrate may be terminated.

In contrast, when the process result for processing the first substrate exceeds the predetermined value (S140), at least one process parameter may be modified on the basis of the look-up table (S160). For example, if the process result value for processing the first substrate deviates from the sweet zone SZ, at least one of the first through third process parameters may be modified.

As an example, the process result values for the first substrate may deviate from the sweet zone SZ and be located in the region Z11 or Z12 corresponding to the first process parameters. In this case, a feedback control of controlling (or modifying) the first process parameter such that the process result value of the first substrate is located within the sweet zone SZ may be performed. As another example, the process result value for the first substrate may deviate from the sweet zone SZ and be located in the region Z21 or Z22 corresponding to the second process parameters. In such a case, a feedback control of controlling (or modifying) the second process parameter such that the process result value of the first substrate is located within the sweet zone SZ may be performed. As yet another example, the process result value for the first substrate may deviate from the sweet zone SZ and be located in region Z31 or Z32 corresponding to the third process parameter. In such a case, a feedback control of controlling (or modifying) the third process parameter such that the process result value of the first substrate is located within the sweet zone SZ may be performed.

Subsequently, a next process for a next substrate W (hereinafter referred to as a second substrate) may be performed (S135). For example, the process gas may be provided (e.g., S10 of FIG. 2), the process etchant having a predetermined composition rate may be generated from the process gas using the plasma ignition (e.g., S20 of FIG. 2), and the second substrate may be processed using the process etchant (e.g., S30 of FIG. 2).

As at least one process parameter is modified on the basis of the look-up table (S160), if the process result of the process for the second substrate does not exceed the predetermined value (S145), the process for the second substrate may be terminated (S150).

In contrast, even if at least one process parameter is modified on the basis of the look-up table (S160), if the process result for processing the second substrate exceeds the predetermined value (S145), at least one process parameter may be modified again on the basis of the look-up table (S160).

In some example embodiments, the operation of modifying at least one process parameter on the basis of the look-up table may be performed a predetermined number of times. For example, the number of times of modifying the at least one process parameter (hereinafter, the number of times of failure) may be limited to a predetermined value (e.g., about 3 times to about 5 times). In some example embodiments, the predetermined value may be changed according to a user input, which may be provided through a user interface.

In some example embodiments, when the number of times of failure exceeds a predetermined value (S170), the look-up table may be modified (S180). For example, a modified look-up table may be established by performing the window test for at least one process parameter again. At least one process parameter may then be modified on the basis of the modified look-up table (S160). Accordingly, the process control of setting the process result value for the substrate W to be located within the sweet zone SZ may be performed.

Figure 9:
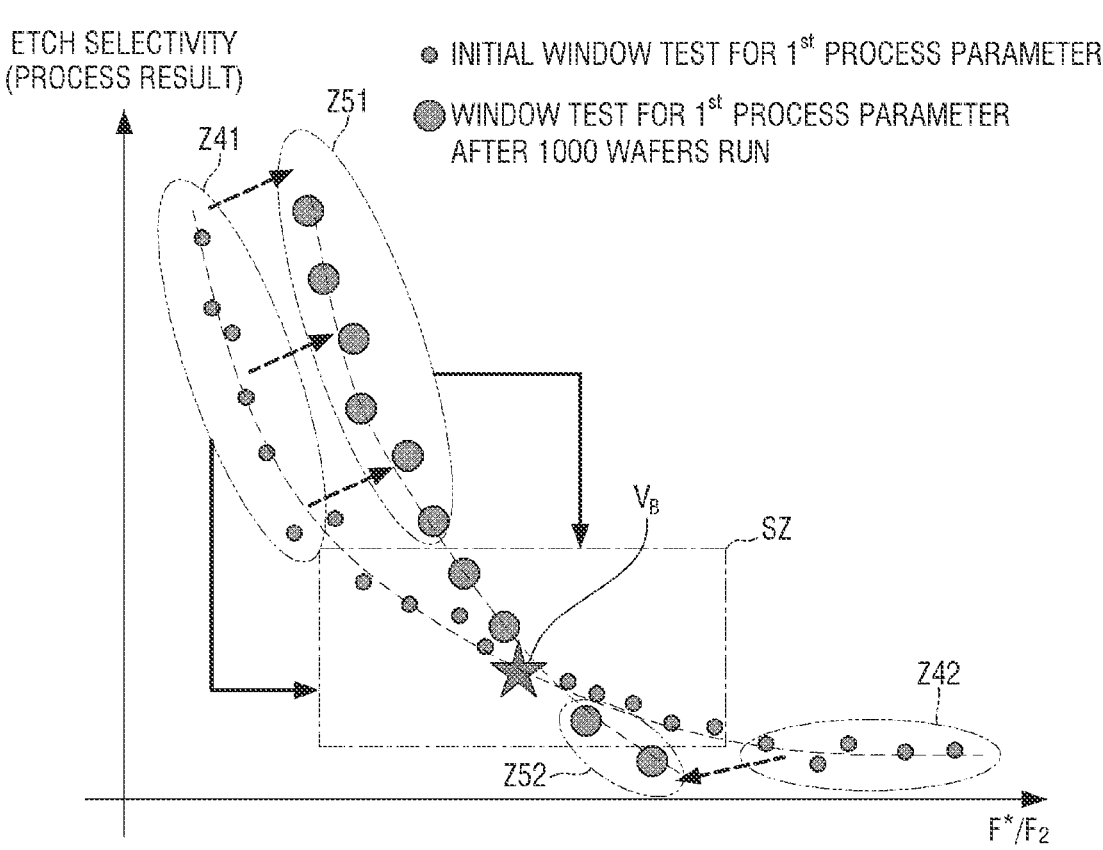

In some example embodiments, the operation (S180) of modifying the look-up table may be performed periodically. For example, as the substrate processing apparatus continues to operate, the window test results may change from the initial window test results. As an example, as shown in FIG. 9, regions Z41 or Z42 that deviate from the sweet zone SZ in the initial window test results may be shifted to regions Z51 or Z52 that deviate from the sweet zone SZ after operation for 1000 wafers. In such a case, at least one process parameter may be modified (S160) on the basis of the modified look-up table after operating on 1000 wafers. The feedback control may be performed on the basis of a look-up table representative of current operation conditions.

FIGS. 10 to 13 are various exemplary conceptual diagrams for explaining the substrate processing apparatus according to some example embodiments. For convenience of explanation, repeated parts of contents explained above using FIGS. 1 to 9 will be briefly explained or omitted.

Figure 10:
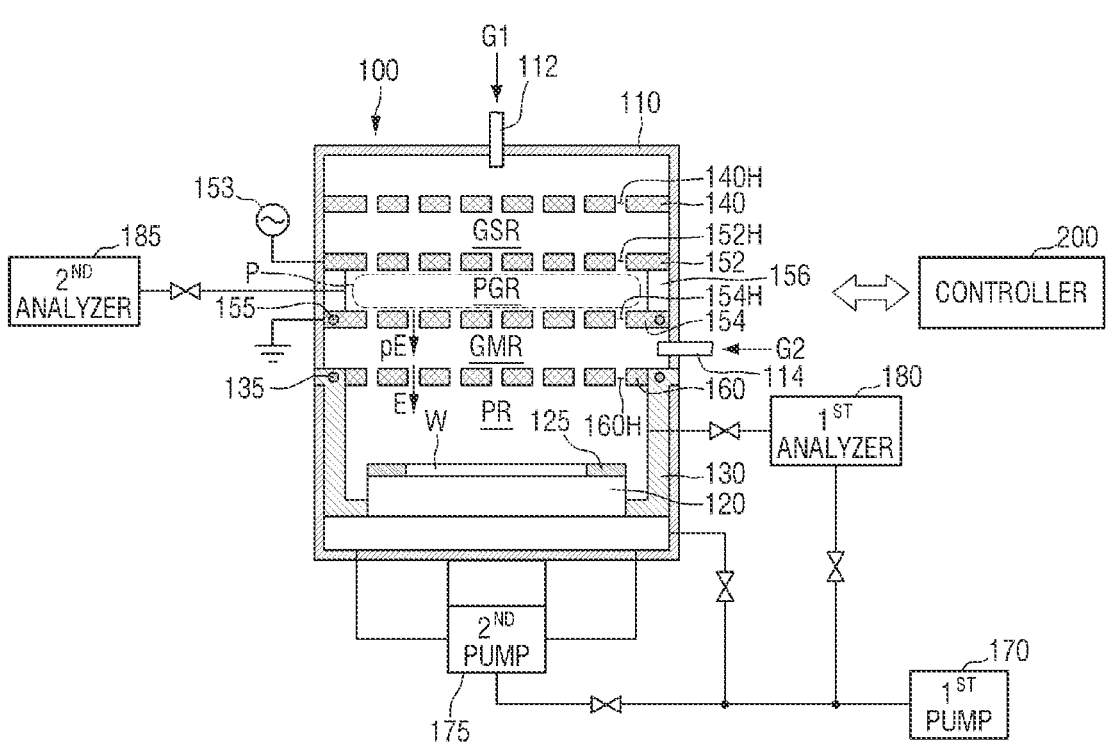
FIGS. 10 to 13 are various exemplary conceptual diagrams for explaining the substrate processing apparatus according to some example embodiments.

Referring to FIG. 10, the substrate processing apparatus according to some example embodiments further include a second analyzer 185.

The second analyzer 185 may be connected to the chamber body 110. The second analyzer 185 may analyze gas within the plasma generation region PGR. For example, the second analyzer 185 may measure and analyze the composition rate of the plasma P (or the preliminary etchant pE) provided into the plasma generation region PGR. As an example, the second analyzer 185 may measure the rate (e.g., $F^*/F_2$) of the first etchant to the second etchant of the preliminary etchant pE.

In some example embodiments, the second analyzer 185 may include an optical emission spectrometer (OES) and/or a residual gas analyzer (RGA). The optical emission spectrometer (OES) is equipment that analyzes the state of a plasma P using light emitted from the plasma P, and may monitor the plasma process in real time in a non-destructive manner. The controller 200 is connected to the process chamber 100, the first gas supplier 112, the second gas supplier 114, the first pump 170, the second pump 175, the first analyzer 180 and/or the second analyzer 185, and may perform the process control for the substrate W.

In some example embodiments, the controller 200 may perform the process control, using a correlation between the composition rate (e.g., $F^*/F_2$) of the process etchant E monitored through the first analyzer 180 and the composition rate (e.g., $F^*/F_2$) of the plasma P (or the preliminary etchant pE) monitored by the second analyzer 185. The process control will be described more specifically later in the description shown in FIGS. 13 and 14.

Figure 11:
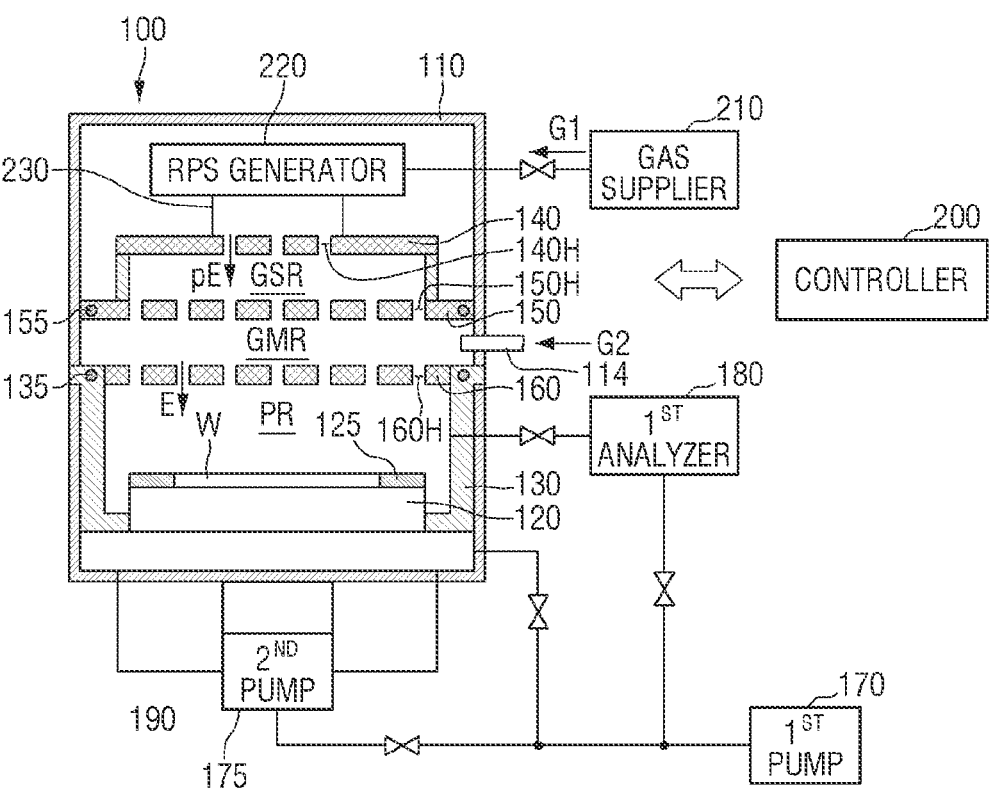

Referring to FIG. 11, the substrate processing apparatus according to some example embodiments includes a gas supplier 210 and a remote plasma generator 220.

The gas supplier 210 may supply the remote plasma generator 220 with the first process gas G1. The first process gas G1 may be a source gas for generating the plasma. In some example embodiments, the first process gas G1 may include a fluorine (F)-containing gas. For example, the first process gas G1 may include, but is not limited to, at least one of $NF_3$, $SiF_6$, $CF_4$, and HF. In some example embodiments, the first process gas G1 may further include an inert gas such as helium (He).

The remote plasma generator 220 may generate a remote plasma source (RPS) and supply it to the process chamber 100. For example, the remote plasma generator 220 may be supplied with the first process gas G1 from the gas supplier 210, turn the first process gas G1 into plasma, and provide the plasma generated through a plasma supply route 230 connected to the gas supply plate 140 into the gas supply region GSR. At least some of the plasma generated by the remote plasma generator 220 may be provided to the gas supply region GSR to generate the preliminary etchant pE. The remote plasma generator 220 may be disposed inside the chamber body 110 or may be disposed outside the chamber body 110 to provide a remote plasma source into the chamber body 110.

The controller 200 may be connected to the gas supplier 210, the remote plasma generator 220, the process chamber 100, the second gas supplier 114, the first pump 170, the second pump 175, and/or the first analyzer 180 to perform the process control on the substrate W.

Figure 12:
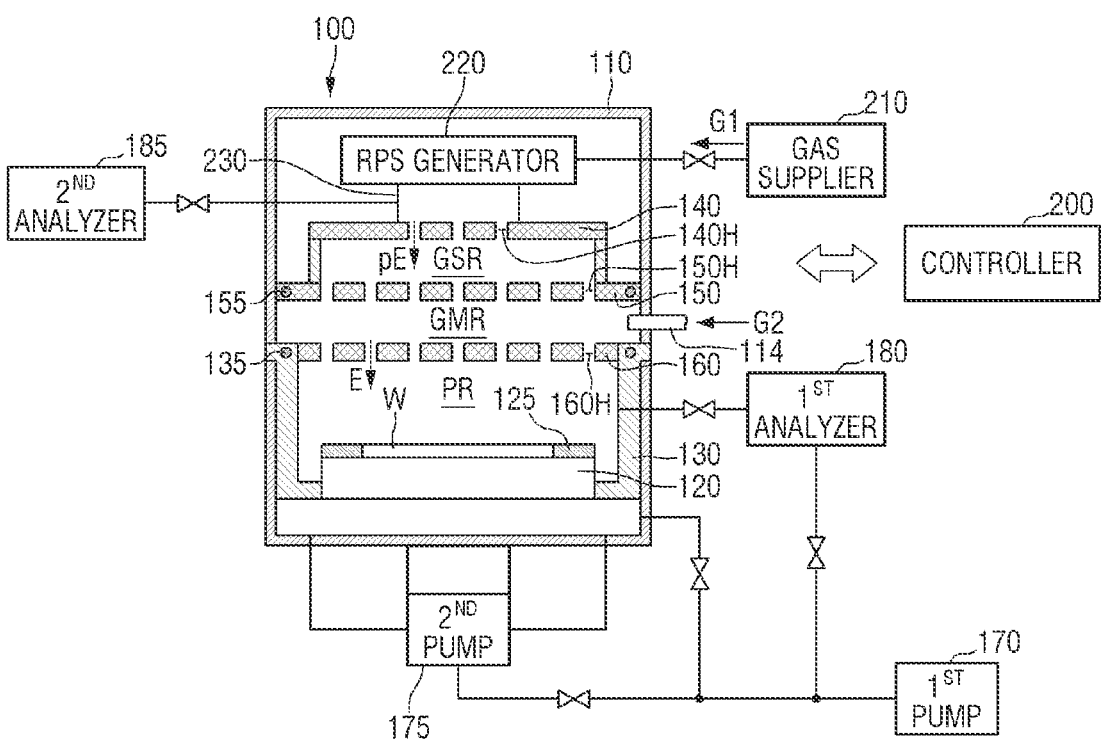

Referring to FIG. 12, the substrate processing apparatus according to some example embodiments includes a gas supplier 210, a remote plasma generator 220 and a second analyzer 185.

The second analyzer 185 may be connected to the plasma supply route 230. The second analyzer 185 may analyze the remote plasma source generated from the remote plasma generator 220. For example, the second analyzer 185 may measure and analyze the composition rate of the plasma (or preliminary etchant pE) provided to the gas supply region GSR through the plasma supply route 230. As an example, the second analyzer 185 may measure the rate (e.g., $F^*/F_2$) of the first etchant to the second etchant of the preliminary etchant pE.

In some example embodiments, the second analyzer 185 may include an optical emission spectrometer (OES) and/or a residual gas analyzer (RGA).

The controller 200 may be connected to the gas supplier 210, the remote plasma generator 220, the process chamber 100, the second gas supplier 114, the first pump 170, the second pump 175, the first analyzer 180 and/or the second analyzer 185 to perform a process control on the substrate W.

In some example embodiments, the controller 200 may perform the process control, using a correlation between the composition rate (e.g., $F^*/F_2$) of the process etchant E monitored through the first analyzer 180 and the composition rate (e.g., $F^*/F_2$) of the plasma P (or the preliminary etchant pE) monitored through the second analyzer 185. The process control will be described later more specifically in the description of FIGS. 13 and 14.

Figure 13:
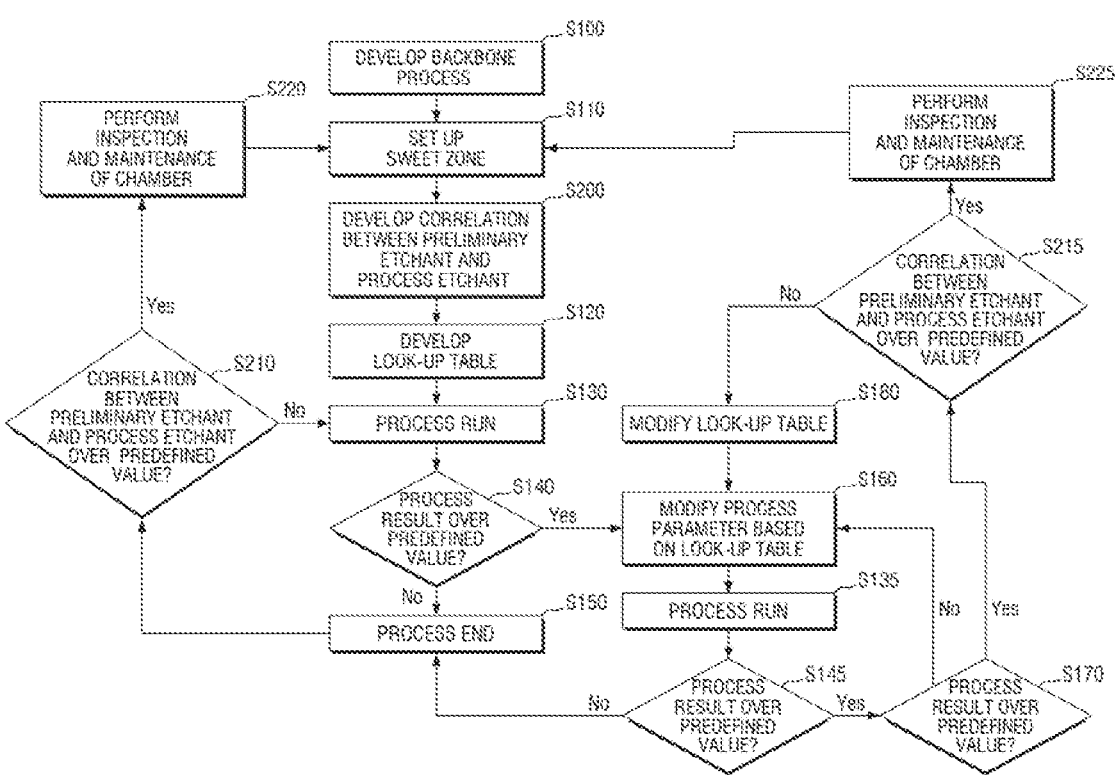
Figure 14:
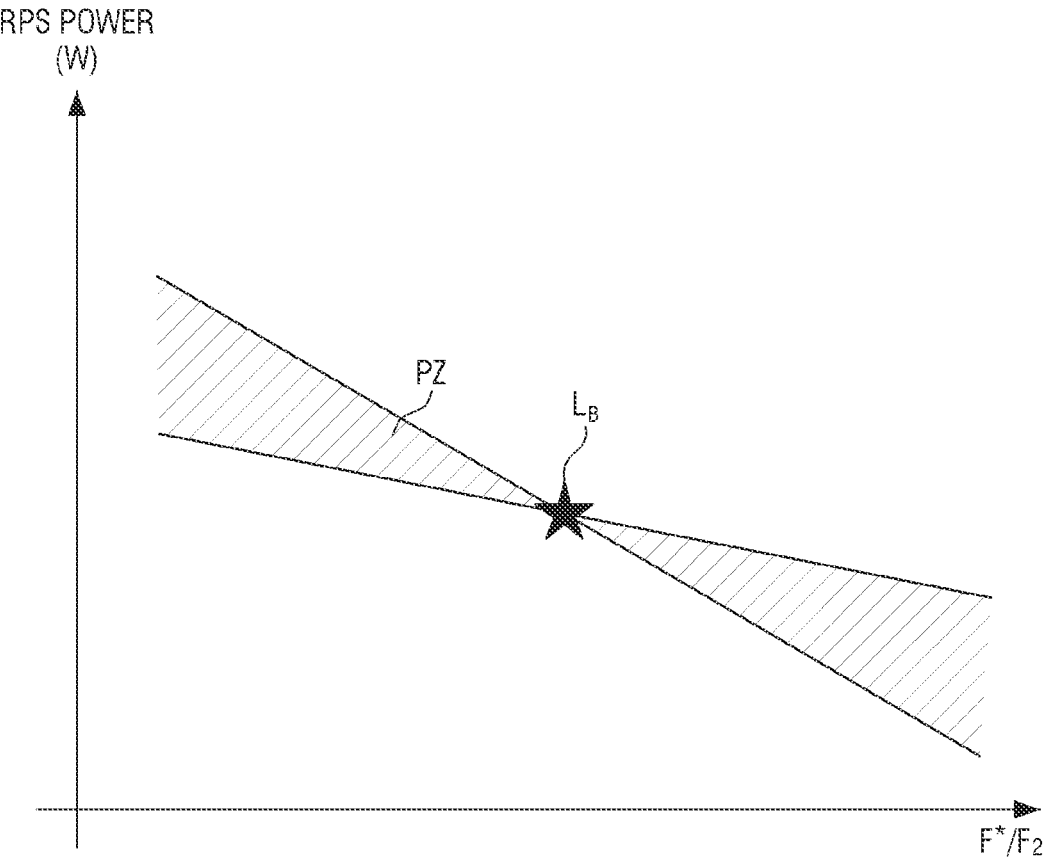
FIG. 14 is an exemplary graph for explaining the operation of performing the process control according to FIG. 13.

FIG. 13 is an exemplary flow chart for explaining an operation of performing the process control in a substrate processing method according to some example embodiments. FIG. 14 is an exemplary graph for explaining the operation of performing the process control according to FIG. 13.

Referring to FIGS. 13 and 14, after establishing the backbone process (S100), a correlation between the preliminary etchant (or plasma) and the process etchant is established (S200).

The operation of establishing the correlation between the preliminary etchant (or plasma) and the process etchant may include an operation of measuring the composition rate of the process etchant that changes by changing the conditions of the preliminary etchant. The conditions of the preliminary etchant may change depending on, for example, the composition rate (e.g., $F^*/F_2$) of the preliminary etchant, the output of the plasma, the flow rate of the process gas, or the operating time of the substrate processing apparatus.

As an example, as shown in FIG. 14, the composition rate (e.g., $F^*/F_2$) of the process etchant E measured through the first analyzer 180 may be measured, while changing the remote plasma source output (RPS power, for example, the output of the remote plasma generator (e.g., 220 of FIG. 12)) on the basis of a correlation value $L_B$ of the backbone process. Accordingly, the $F^*/F_2$ of the process etchant according to the remote plasma source power (RPS power) may be shown in FIG. 14.

Subsequently, after finishing the process for the first substrate (S150), it is determined whether the correlation between the preliminary etchant (or plasma) and the process etchant exceeds a predetermined value (S210).

If the correlation between the preliminary etchant (or plasma) and the process etchant does not exceed a predetermined value (S210), the next process for the next substrate W (hereinafter referred to as the second substrate) may be performed (S130). As an example, if the correlation between the remote plasma source power (RPS power) and the $F^*/F_2$ of the process etchant is located within a predetermined tolerance range (e.g., PZ of FIG. 14), the process gas may be provided (e.g., S10 of FIG. 2), the process etchant having a predetermined composition rate may be generated from the process gas using the plasma ignition (e.g., S20 of FIG. 2), and the second substrate may be processed using the process etchant (e.g., S30 of FIG. 2).

In contrast, if the correlation between the preliminary etchant (or plasma) and the process etchant exceeds a predetermined value (S210), the chamber is inspected and maintained (S220). As an example, if the correlation between the remote plasma source power (RPS power) and the $F^*/F_2$ of the process etchant is located outside a predetermined tolerance range (e.g., PZ of FIG. 14), a preventive maintenance (PM) may be performed on the process chamber 100. Accordingly, the hardware analysis and replacement of the process chamber 100 may be performed to maintain the correlation between the preliminary etchant (or plasma) and the process etchant within a predetermined range.

After the inspection and maintenance are performed on the chamber (S220), the sweet zone may be reset (S110), and the look-up table may be established again (S120). Accordingly, the feedback control may be performed on the basis of a look-up table representative of current operation conditions.

In some example embodiments, if the number of times of failure exceeds a predetermined value (S170), it may be determined whether the correlation between the preliminary etchant (or plasma) and the process etchant exceeds a predetermined value (S215). If the correlation between the preliminary etchant (or plasma) and the process etchant does not exceed a predetermined value (S215), the look-up table may be modified (S180). If the correlation between the preliminary etchant (or plasma) and the process etchant exceeds a predetermined value (S215), the inspection and maintenance may be performed on the chamber (S225).

After the inspection and maintenance are performed on the chamber (S225), the sweet zone may be reset (S110), and the look-up table may be established again (S120). Accordingly, the feedback control may be performed on the basis of a look-up table representative of current operation conditions.

A method of fabricating a semiconductor device according to example embodiments will be described below with reference to FIGS. 1 to 23. Although the description of FIGS. 16 to 23 exemplifies a method of fabricating a field-effect transistor (FET) including a multi-bridge channel, specifically a multi-bridge-channel (MBCFET®), those of ordinary skill in the art to which the present disclosure pertains will appreciate that the technical idea of the present disclosure may also be applied to methods of fabricating other semiconductor devices.

Figure 15:
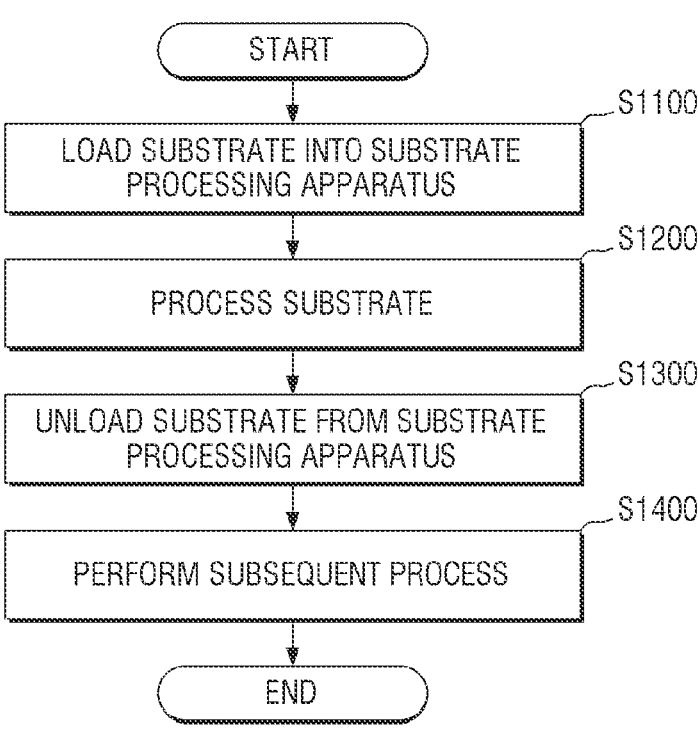
FIG. 15 is a flow chart for explaining the method of fabricating the semiconductor device according to some example embodiments.

FIG. 15 is a flow chart for explaining the method of fabricating the semiconductor device according to some example embodiments. For convenience of explanation, repeated parts of contents explained above using FIGS. 1 to 14 will be briefly explained or omitted.

Referring to FIG. 15, first, a substrate is loaded into the substrate processing apparatus (S1100).

The substrate W may, for example, include silicon (Si). The substrate W may include semiconductor devices such as germanium (Ge) or compound semiconductors such as SiC (silicon carbide), GaAs (gallium arsenide), InAs (indium arsenide) and InP (indium phosphide). In some example embodiments, the substrate W may include a conductive region, for example, a well doped with impurities. The substrate W may have a first side, which is an active side, and a second side, which is an inactive side opposite to the first side. The substrate W may be disposed on the substrate support 120 such that the second side is opposite to the substrate support 120.

The substrate W may be a wafer that has undergone a series of processes. The series of processes that may be performed on the substrate W may include, for example, i) an oxidation process for forming an oxide film, ii) a lithography process including spin coating, exposure and development, iii) a thin film deposition process, iv) a dry or wet etching process and/or v) a metal wiring process, and the like.

The oxidation process is a process of causing oxygen or water vapor to chemically react with the silicon substrate surface at a high temperature of 800° C. to 1200° C. to form a thin and uniform silicon oxide film. The oxidation process may include a dry oxidation and a wet oxidation. In the dry oxidation, an oxide film may be formed by reacting with oxygen gas, and in wet oxidation, an oxide film may be formed by causing oxygen to react with water vapor.

In some example embodiments, a silicon on insulator (SOI) structure may be formed on the substrate W by the oxidation process. The substrate W may include a buried oxide layer. In some example embodiments, the substrate may have various element isolation structures such as shallow trench isolation (STI).

The lithography process is a process of transferring a circuit pattern previously formed on a lithography mask onto the substrate W through the exposure. The lithographic process may be performed in the sequence of spin coating, exposure and development processes.

The thin film deposition process may be, for example, any one of an atomic layer deposition (ALD), a chemical vapor deposition (CVD), a plasma-enhanced CVD (PECVD), a metal organic CVD (MOCVD), a physical vapor deposition (PVD), a reactive pulse laser deposition method, a molecular beam epitaxy, and a DC magnetron sputtering.

The dry etching process may be, for example, any one of a reactive ion etching (RIE), a deep RIE (DRIE), an ion beam etching (IBE), and an Ar milling. As another example, the dry etching process that may be performed on the substrate W may be an atomic layer etching (ALE). Also, the wet etching process that may be performed on the substrate W may be an etching process that uses at least one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $P_2$, $SO_2$ and COS as the etchant gas.

The metal wiring process may be a process of forming a conductive wiring (metal wiring) to implement a circuit pattern for operating of the semiconductor device. Ground, power and transmission paths of signals for operating the semiconductor devices may be formed by the metal wiring process. The metal wiring may include gold, platinum, silver, aluminum, tungsten, and the like.

In some example embodiments, a planarization process such as a chemical-mechanical polishing (CMP) process, an ion implantation process, and the like can also be performed in the semiconductor device formation process.

The substrate W may be transported by a transport device including a sophisticated clean room transport system. The transport device may include a conveyor system or the like. The transport device may load the substrate W into the substrate processing apparatus described above. In some cases, the transport device may load the substrate W into a load port adjacent to the substrate processing apparatus described above, and the substrate W may be loaded from the load port into the substrate processing apparatus described above by a separate robotic arm.

Subsequently, the substrate W is processed (S1200).

The substrate W may be processed by the substrate processing method described above using FIGS. 1 to 14.

Subsequently, the substrate W is unloaded from the substrate processing apparatus (S1300).

Subsequently, subsequent processes are performed (S1400).

For example, the unloaded substrate W may be loaded into equipment for subsequent processes. The subsequent processes may include the oxidation process, the lithography process, the thin film deposition process, the dry or wet etching process and/or the metal wiring process described above, and may include an Electrical Die Sorting (EDS) process, a packaging process and a package test process.

The EDS process may refer to a process of applying an electrical signal to the semiconductor devices formed on the substrate W, and determining whether the semiconductor devices are defective on the basis of a signal that is output from the semiconductor devices in response to the applied electrical signal.

The packaging process may include a wafer back-grinding process, a wafer sawing process, a die attach process, a wire bonding process, a molding process, a marking process, a solder ball mount process, an individualization process, and the like.

The package test process may include an assembly out, a DC test, a burn-in test, a monitoring burn-in test, a post burn-in test, a final test, and the like.

FIGS. 16 to 23 are intermediate process diagrams for explaining a method of fabricating a semiconductor device according to some example embodiments. For convenience of explanation, repeated parts of contents explained above using FIGS. 1 to 15 will be briefly explained or omitted.

Figure 16:
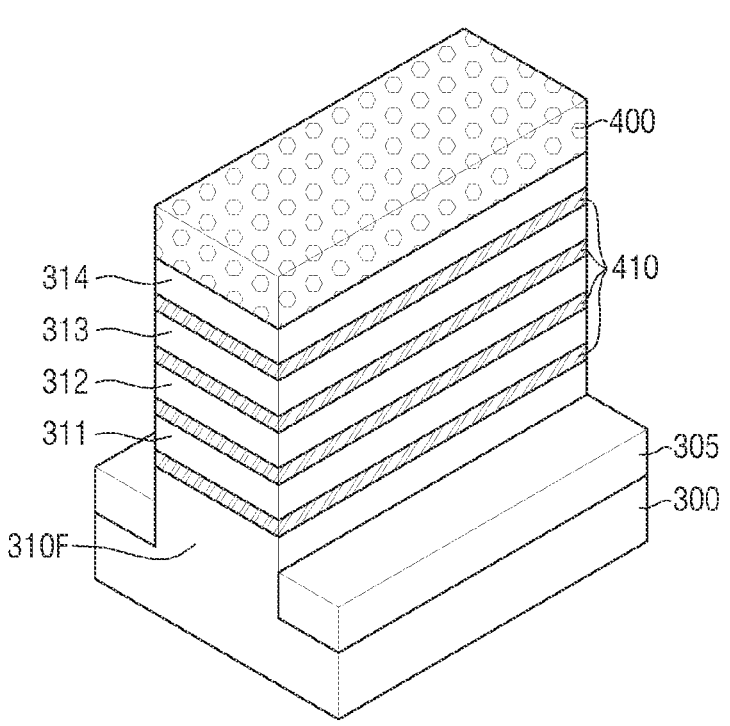

Referring to FIG. 16, a plurality of sheet patterns (e.g., first to fourth sheet patterns 311 to 314) are formed on a substrate 300.

For example, a first material film and a second material film alternately stacked may be formed on the substrate 300. A first mask pattern 400 extending in a first direction may be formed on the first material film and the second material film. Subsequently, a patterning process of patterning the first material film and the second material film using the first mask pattern 400 as an etching mask may be performed. The patterned first material film may form a plurality of sacrificial patterns 410, and the patterned second material film may form sheet patterns (e.g., first to fourth sheet patterns 311 to 314) that are alternately stacked with the sacrificial patterns 410.

The sheet patterns 311 to 314 and the sacrificial patterns 410 may have different etching selectivity with respect to the process etchant described above using FIGS. 1 to 13. As an example, the sheet patterns 311 to 314 may each include silicon (Si), and the sacrificial patterns 410 may each include silicon germanium (SiGe).

In some example embodiments, in the process of patterning the first material film and the second material film, a part of the substrate 300 may be etched to form a fin pattern 310F. A field insulating film 305 may then be formed on the substrate 300. The field insulating film 305 may cover at least a part of the side faces of the fin pattern 310F.

Figure 17:
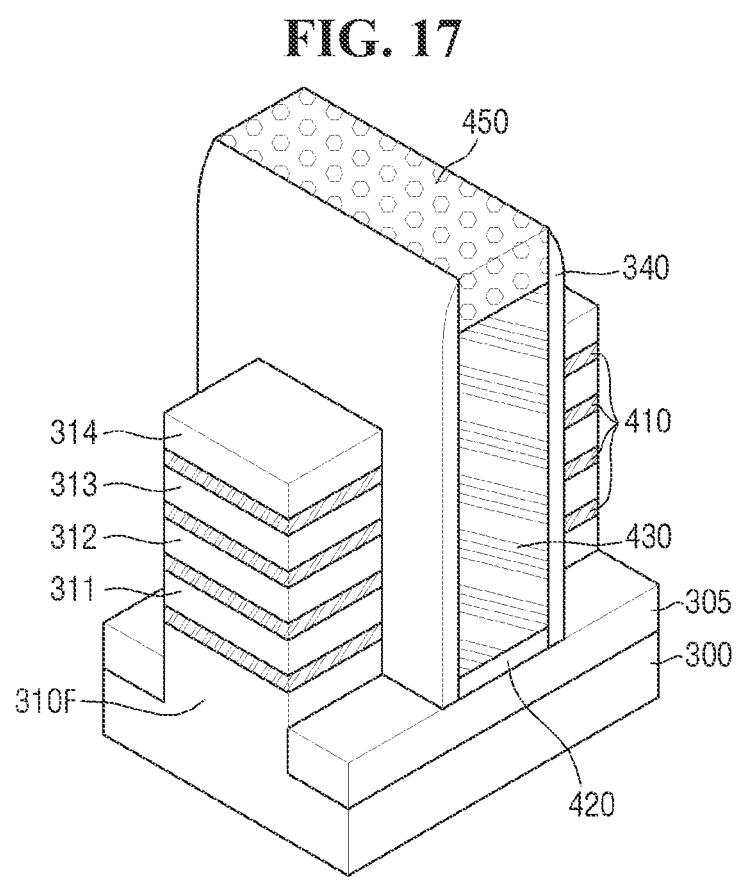

Referring to FIG. 17, dummy gate structures 420 and 430 and a gate spacer 340 are formed on the substrate 300.

The dummy gate structures 420 and 430 may be formed on the substrate 300 and the field insulating film 305. The dummy gate structures 420 and 430 may intersect the sheet patterns 311 to 314 and the sacrificial patterns 410. For example, the dummy gate structures 420 and 430 may extend in a second direction different from the first direction. The sheet patterns 311 to 314 and the sacrificial patterns 410 may each extend in the first direction and penetrate the dummy gate structures 420 and 430.

In some example embodiments, the dummy gate structures 420 and 430 may include a dummy gate dielectric film 420 and a dummy gate electrode 430 that are sequentially stacked on the substrate 300 and the field insulating film 305. For example, a dielectric film and an electrode film that are sequentially stacked may be formed on the substrate 300 and the field insulating film 305. Subsequently, a second mask pattern 450 extending in the second direction may be formed on the electrode film. Subsequently, a patterning process for patterning the dielectric film and the electrode film may be performed, using the second mask pattern 450 as an etching mask. The patterned dielectric film may form the dummy gate dielectric film 420, and the patterned electrode film may form the dummy gate electrode 430.

The dummy gate structures 420 and 430 may have different etching selectivity from the sheet patterns 311 to 314 and the sacrificial patterns 410. As an example, the dummy gate electrode 430 may include polysilicon (poly Si).

A gate spacer 340 may be formed on the substrate 300 and the field insulating film 305. The gate spacer 340 may extend along the side faces of the dummy gate structures 420 and 430.

Figure 18:
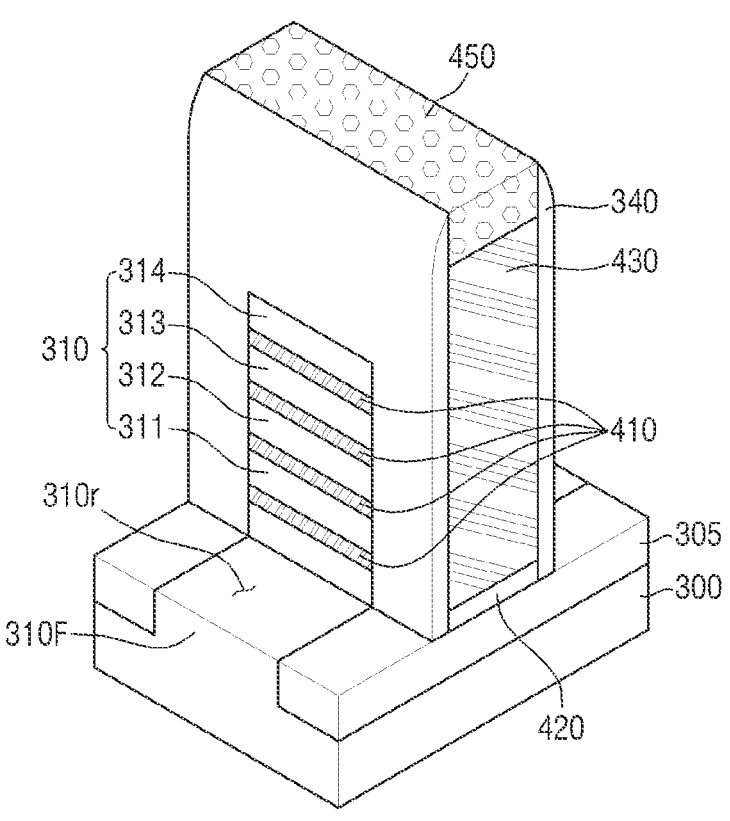

Referring to FIG. 18, a first recess process on the sheet patterns 311 to 314 and the sacrificial patterns 410 is performed.

As the first recess process is performed, some of the sheet patterns 311 to 314 and some of the sacrificial pattern 410 disposed outside the dummy gate structures 420 and 430 may be removed to form a recess 310r. Also, active patterns 310 including the sheet patterns 311 to 314 may be formed. An upper part of the first fin pattern 310F may be removed in the process of forming the recess 310r.

Figure 19:
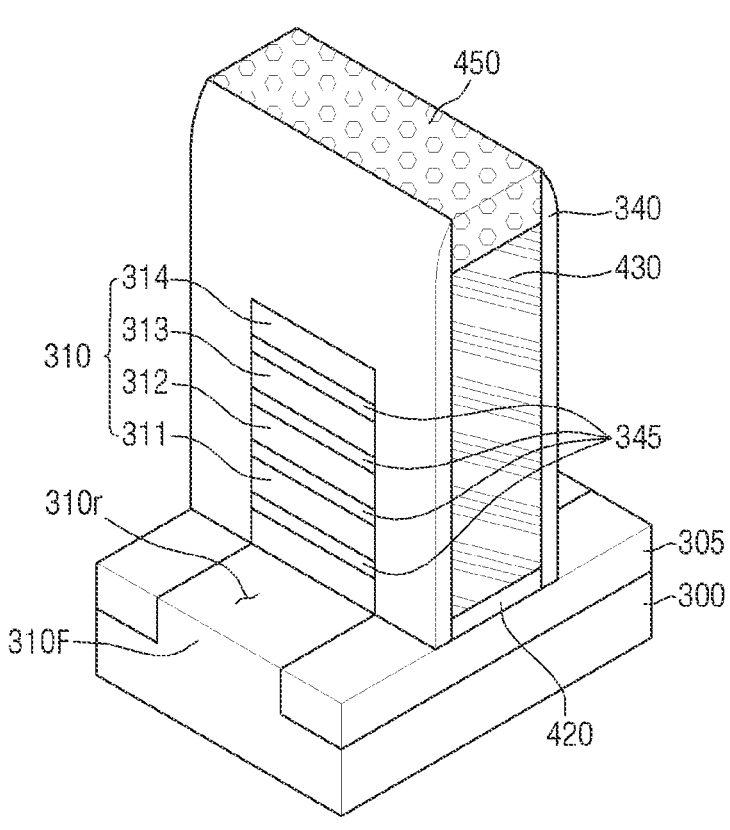

Referring to FIG. 19, an internal spacer 345 is formed on the side face of the dummy gate electrode 430 between the active patterns 310.

For example, a second recess process on the sacrificial patterns 410 exposed by the recess 310r may be performed.

As the second recess process is performed, the side faces of the sacrificial patterns 410 exposed by the recess 310r may be recessed. The internal spacer 345 that replaces the recessed region may then be formed.

In some other example embodiments, the operation of forming the internal spacer 345 may be omitted.

Figure 20:
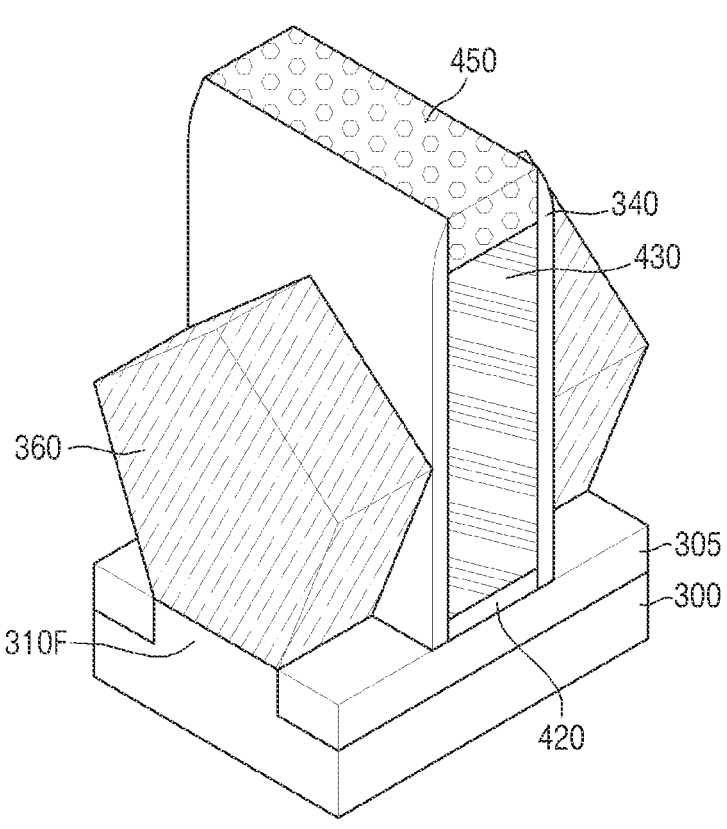

Referring to FIG. 20, a source/drain region 360 is formed on the side faces of the dummy gate structures 420 and 430.

The source/drain region 360 may fill the recess 310r of FIG. 18. For example, the source/drain region 360 may be formed by an epitaxial growth method that uses the fin pattern 310F and the active pattern 310 as seed layers. Accordingly, the source/drain region 360 connected to each active pattern 310 may be formed.

Figure 21:
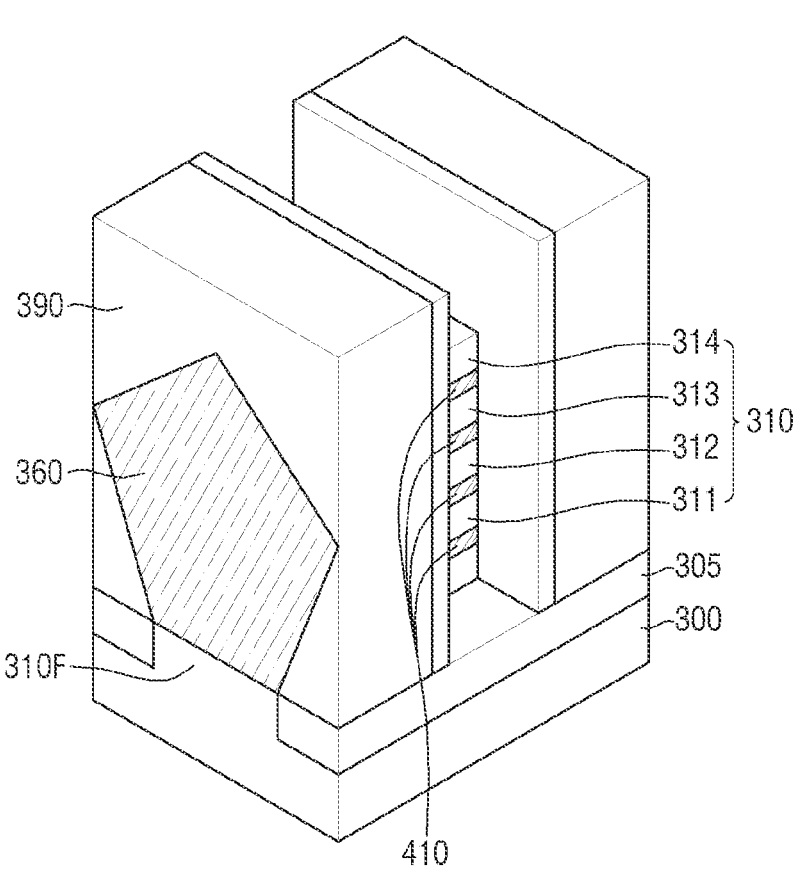

Referring to FIGS. 20 and 21, the dummy gate structures 420 and 430 are removed.

For example, an interlayer insulating film 390 may be formed on the substrate 300 and the field insulating film 305. The interlayer insulating film 390 may be formed to fill the space on the outer face of the gate spacer 340. A planarization process that exposes the dummy gate structures 420 and 430 may then be performed. The planarization process may include, for example, but is not limited to, a chemical-mechanical polishing (CMP) process. Subsequently, the dummy gate structures 420 and 430 exposed by the interlayer insulating film 390 and the gate spacer 340 may be removed.

As mentioned above, because the dummy gate structures 420 and 430 may have different etching selectivity from the sheet patterns 311 to 314 and the sacrificial patterns 410, the dummy gate structures 420 and 430 may optionally be removed. As the dummy gate structures 420 and 430 are removed, the active patterns 310 and the sacrificial patterns 410 disposed inside the gate spacer 340 may be exposed.

Figure 22:
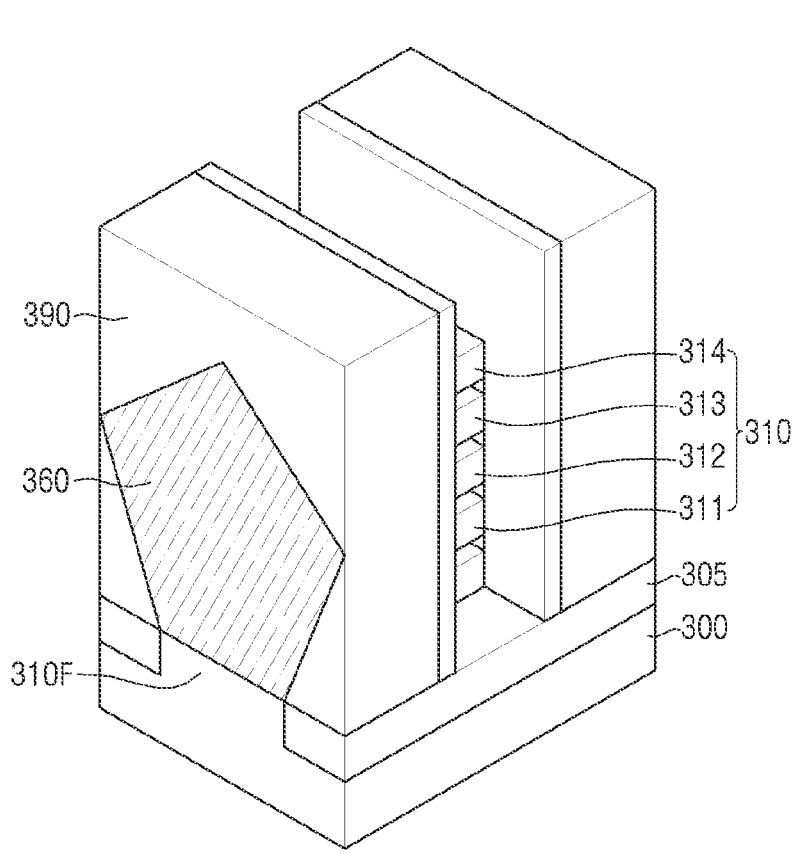

Referring to FIGS. 21 and 22, the sacrificial patterns 410 are removed.

The removal of the sacrificial patterns 410 may be performed by the substrate processing method described above using FIGS. 1 to 14. Accordingly, the sacrificial patterns 410 may be selectively removed with respect to the active patterns 310. As the sacrificial patterns 410 are removed, the active patterns 310 spaced apart from each other may be formed on the substrate 300.

Figure 23:
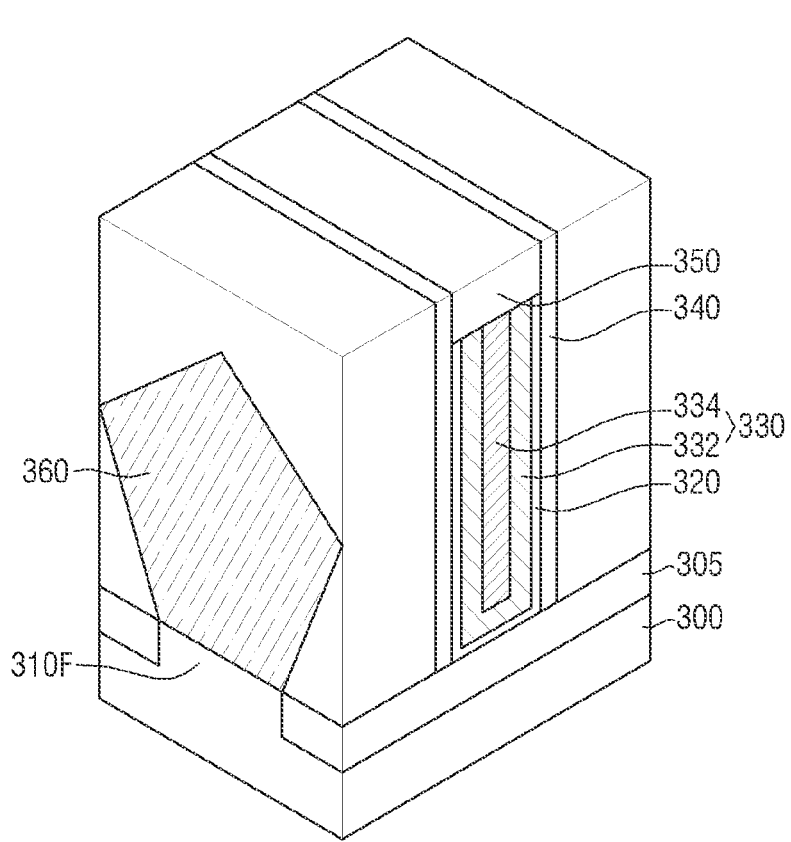

Referring to FIG. 23, a gate dielectric film 320 and a gate electrode 330 are formed.

The gate dielectric film 320 and the gate electrode 330 may be stacked on the active patterns 310. Moreover, the gate electrode 330 may fill the region between the active patterns 310. The active patterns 310 each penetrating through the gate electrodes 330 may be formed accordingly.

In some example embodiments, the gate electrode 330 may include a work function control film 332 that controls the work function, and a filling conductive film 334 that fills a space formed by the work function control film 332. The work function control film 332 and the filling conductive film 334 may be sequentially stacked on each active pattern 310. The work function control film 332 may include, for example, but is not limited to, at least one of TiN, TaN, TiC, TaC, TiON, TiAlC, TiAlN, and combinations thereof. The filling conductive film 334 may include, for example, but is not limited to, W or Al.

In some example embodiments, the gate capping pattern 350 may be formed on the gate electrode 330. The gate capping pattern 350 may cover the upper face of the gate electrode 330. Although the upper face of the gate spacer 340 is only shown as being disposed on the same plane as the upper face of the gate capping pattern 350, this is only an example. As another example, the gate capping pattern 350 may be formed to cover the upper face of the gate spacer 340.

In some example embodiments, each of the components represented by a block as illustrated in FIGS. 1 and 10-12 may be implemented as various numbers of hardware, software and/or firmware structures that execute respective functions described above, according to example embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

What is claimed is:

1. A method of fabricating a semiconductor device, the method comprising:

loading a substrate into a substrate processing apparatus; and processing the substrate, using the substrate processing apparatus, wherein the processing the substrate comprises:

providing a process gas;

generating a process etchant from the process gas, using plasma ignition, the process etchant including a first etchant and a second etchant;

processing the substrate, using the process etchant;

analyzing a composition of the process etchant; and controlling the processing of the substrate by controlling a generation rate of the second etchant based on a process result of the analyzing.

2. The method of fabricating the semiconductor device of claim 1, wherein the controlling comprises:

establishing a backbone process for processing a backbone substrate using the process etchant;

setting a sweet zone including a process result value for the backbone process;

performing a window test on at least one process parameter of the backbone process to establish a look-up table indicating a plurality of process result values according to the at least one process parameter; and performing a feedback control such that a process result value for processing the substrate is provided within the sweet zone, by controlling the at least one process parameter using the look-up table, based on the process result value for processing the substrate deviating from the sweet zone.

3. The method of fabricating the semiconductor device of claim 2, wherein generating the process etchant comprises:

generating a preliminary etchant including the first etchant and the second etchant from the process gas, using the plasma ignition; and controlling the generation rate of the second etchant to generate the process etchant.

4. The method of fabricating the semiconductor device of claim 3, wherein the feedback control is performed based on a correlation between a composition of the preliminary etchant and the composition of the process etchant.

5. The method of fabricating the semiconductor device of claim 1, wherein the process gas includes a fluorine-containing gas, wherein the first etchant includes F-radical (F*), and wherein the second etchant includes $F_2$.

6. The method of fabricating the semiconductor device of claim 5, wherein the substrate includes a first material film and a second material film provided on the first material film, the first material film including silicon (Si), and the second material film including silicon germanium (SiGe), and wherein the processing the substrate using the process etchant comprises performing a selective etching process of the second material film.

7. The method of fabricating the semiconductor device of claim 6, wherein the first material film and the second material film are alternately stacked on the substrate.

8. A substrate processing method comprising:

providing a process gas;

generating a process etchant from the process gas using a plasma ignition, the process etchant including a first etchant and a second etchant;

processing a substrate using the process etchant; and controlling the processing the substrate, wherein the controlling comprises:

establishing a backbone process for processing a backbone substrate using the process etchant;

setting a sweet zone including a process result value for the backbone process;

performing a window test on at least one process parameter of the backbone process to establish a look-up table indicating a plurality of process result values according to the at least one process parameter; and performing a feedback control such that a process result value for processing the substrate is provided within the sweet zone, by controlling the at least one process parameter using the look-up table, based on the process result value for processing the substrate deviating from the sweet zone.

9. The substrate processing method of claim 8, wherein generating the process etchant comprises:

generating a preliminary etchant including the first etchant and the second etchant from the process gas, using the plasma ignition, and controlling a generation rate of the second etchant to generate the process etchant.

10. The substrate processing method of claim 9, wherein the feedback control is performed based on determining whether to modify the look-up table based on a correlation between the preliminary etchant and the process etchant.

11. The substrate processing method of claim 8, wherein the process gas includes a fluorine-containing gas, wherein the first etchant includes F-radical (F*), and wherein the second etchant includes $F_2$.

12. The substrate processing method of claim 8, wherein processing the substrate comprises performing a selective etching process on the substrate, using the process etchant.

13. The substrate processing method of claim 12, wherein the at least one process parameter comprises at least one of a process temperature, a process pressure, a process time, a flow rate of the process gas, and a power of the plasma ignition.

14. The substrate processing method of claim 12, wherein the plurality of process result values comprise at least one of an etching selectivity, an etching volume, a substrate contamination, a yield, and a residue volume after etching.

* * * * *